United States Patent
Kawato et al.

(10) Patent No.: US 9,240,572 B2
(45) Date of Patent: Jan. 19, 2016

(54) VAPOR DEPOSITION DEVICE, VAPOR DEPOSITION METHOD, AND ORGANIC EL DISPLAY DEVICE

(75) Inventors: Shinichi Kawato, Osaka (JP); Satoshi Inoue, Osaka (JP); Tohru Sonoda, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/984,799

(22) PCT Filed: Mar. 2, 2012

(86) PCT No.: PCT/JP2012/055380
§ 371 (c)(1),
(2), (4) Date: Aug. 9, 2013

(87) PCT Pub. No.: WO2012/124512
PCT Pub. Date: Sep. 20, 2012

(65) Prior Publication Data
US 2013/0337597 A1    Dec. 19, 2013

(30) Foreign Application Priority Data
Mar. 11, 2011    (JP) .................................. 2011-054319

(51) Int. Cl.
*H01L 51/56*    (2006.01)
*C23C 14/04*    (2006.01)
(Continued)

(52) U.S. Cl.
CPC .............. *H01L 51/56* (2013.01); *C23C 14/044* (2013.01); *C23C 14/12* (2013.01); *C23C 14/562* (2013.01); *C23C 16/45578* (2013.01); *H01L 51/0011* (2013.01)

(58) Field of Classification Search
CPC ............ H01L 51/56; H01L 2924/0002; H01L 2924/00; H01L 51/5012; H01L 51/5253; H01L 21/31116; H01L 2224/48091; H01L 51/0011; H01L 51/0085; C23C 14/042; C23C 16/042; C23C 16/50; C23C 14/243
See application file for complete search history.

(56) References Cited

U.S. PATENT DOCUMENTS

| | | |
|---|---|---|
| 5,742,129 A | 4/1998 | Nagayama et al. |
| 6,294,892 B1 | 9/2001 | Utsugi et al. |

(Continued)

FOREIGN PATENT DOCUMENTS

| | | |
|---|---|---|
| JP | 8-227276 A | 9/1996 |
| JP | 2000-188179 A | 7/2000 |

(Continued)

OTHER PUBLICATIONS

International Search Report received for PCT Patent Application No. PCT/JP2012/055380, mailed on May 29, 2012, 5 pages (2 pages of English Translation and 3 pages of PCT Search Report).

*Primary Examiner* — Robert Bachner
(74) *Attorney, Agent, or Firm* — Morrison & Foerster LLP

(57) ABSTRACT

A vapor deposition device includes a vapor deposition source (60) having a plurality of vapor deposition source openings (61) that discharge vapor deposition particles (91), a limiting unit (80) having a plurality of limiting openings (82), and a vapor deposition mask (70) in which a plurality of mask openings (71) are formed only in a plurality of vapor deposition regions (72) where the vapor deposition particles that have passed through a plurality of limiting openings reach. The plurality of vapor deposition regions are arranged along a second direction that is orthogonal to the normal line direction of the substrate (10) and the movement direction of the substrate, with non-vapor deposition regions (73) where the vapor deposition particles do not reach being sandwiched therebetween. Mask openings through which the vapor deposition particles pass are formed at different positions in the movement direction of the substrate from the positions of the non-vapor deposition regions located on a straight line parallel to the second direction, as viewed along the normal line direction of the substrate. Accordingly, it is possible to stably form a vapor deposition coating film in which edge blurring is suppressed at a desired position on a substrate.

6 Claims, 24 Drawing Sheets

(51) Int. Cl.
*C23C 14/12* (2006.01)
*C23C 14/56* (2006.01)
*C23C 16/455* (2006.01)
*H01L 51/00* (2006.01)

(56) References Cited

U.S. PATENT DOCUMENTS

| | | |
|---|---|---|
| 2010/0297348 A1 | 11/2010 | Lee et al. |
| 2010/0297349 A1 | 11/2010 | Lee et al. |
| 2011/0053300 A1* | 3/2011 | Ryu et al. .................. 438/34 |
| 2011/0168986 A1* | 7/2011 | Lee et al. .................. 257/40 |

| | | |
|---|---|---|
| 2013/0059063 A1 | 3/2013 | Kawato et al. |

FOREIGN PATENT DOCUMENTS

| | | |
|---|---|---|
| JP | 2004-349101 A | 12/2004 |
| JP | 2008-150662 A | 7/2008 |
| JP | 2010-270396 A | 12/2010 |
| JP | 2010-270397 A | 12/2010 |
| JP | 2011-47035 A | 3/2011 |
| JP | 2011-146377 A | 7/2011 |
| JP | 2012-72461 A | 4/2012 |
| WO | 2011/145456 A1 | 11/2011 |

* cited by examiner

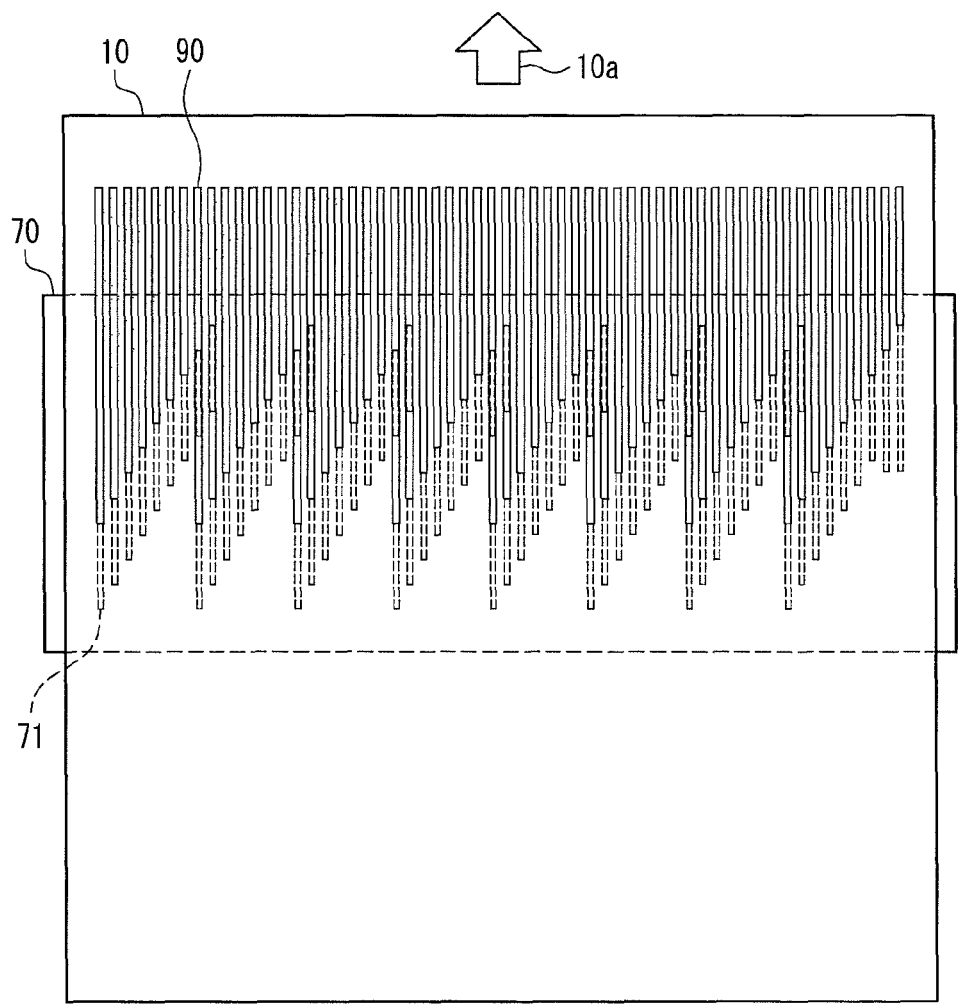
FIG. 21
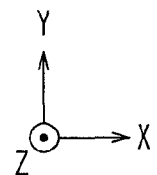

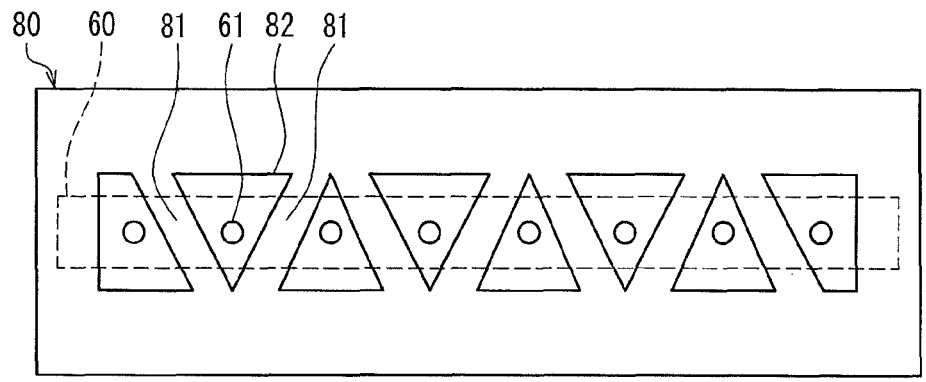
FIG. 22
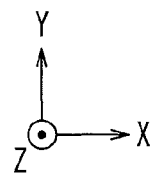
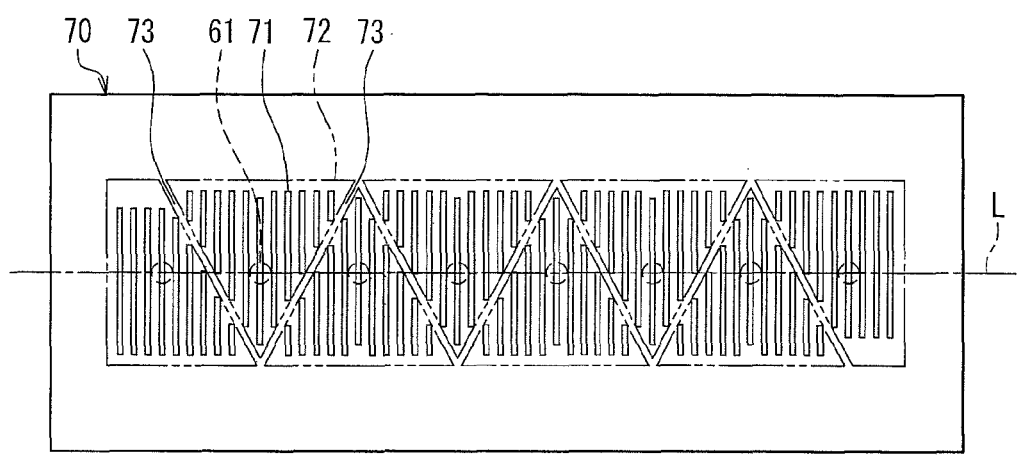
FIG. 23
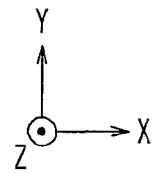

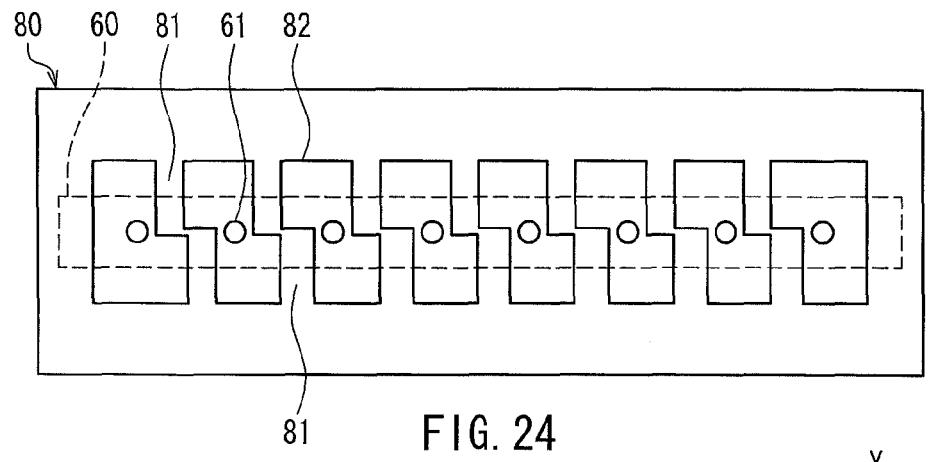
FIG. 24
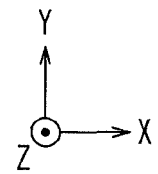
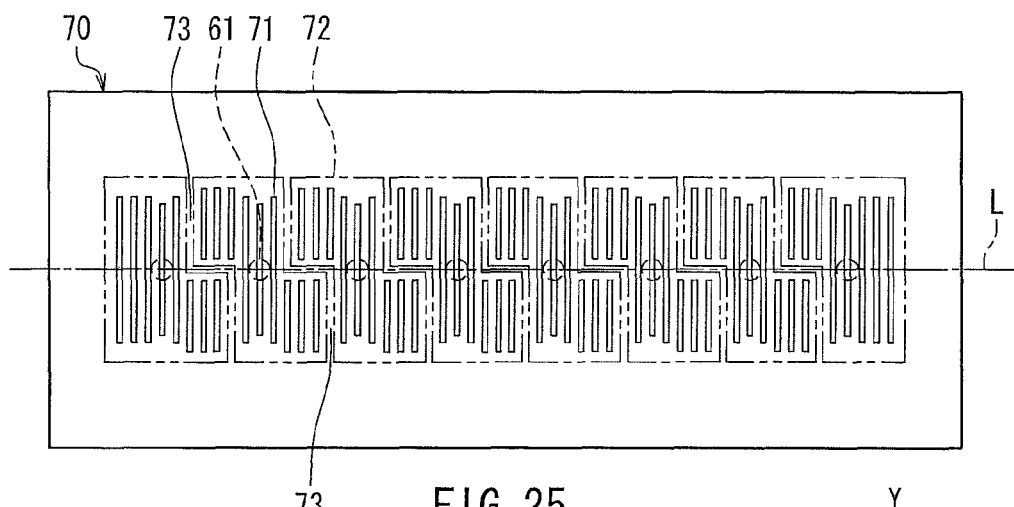
FIG. 25
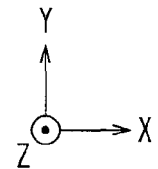

VAPOR DEPOSITION DEVICE, VAPOR DEPOSITION METHOD, AND ORGANIC EL DISPLAY DEVICE

CROSS REFERENCE TO RELATED APPLICATIONS

This is a U.S. National Phase patent application of PCT/JP2012/055380, filed Mar. 2, 2012, which claims priority to Japanese patent application no. 2011-054319, filed Mar. 11, 2011, each of which is hereby incorporated by reference in the present disclosure in its entirety.

TECHNICAL FIELD

The present invention relates to a vapor deposition device and a vapor deposition method for forming a coating film having a predetermined pattern on a substrate. The present invention also relates to an organic EL (Electro Luminescence) display device including an organic EL element including a light emitting layer formed by vapor deposition.

BACKGROUND ART

In recent years, flat panel displays are used in various commodity products and fields, and thus flat panel displays are required to have a large size, high image quality and low power consumption.

Under the circumstances, organic EL display devices, which include an organic EL element that utilizes electro luminescence of an organic material, are attracting great attention as all-solid state flat panel displays that are excellent as having capability of low voltage operation, quick responsivity and light emission.

Active matrix type organic EL display devices, for example, are provided with a thin film-like organic EL element on a substrate having a TFT (thin film transistor). In the organic EL element, organic EL layers including a light emitting layer are laminated between a pair of electrodes. The TFT is connected to one of the pair of electrodes. Then, voltage is applied across the pair of electrodes so as to cause the light emitting layer to emit light, whereby an image is displayed.

In a full-color organic EL display device, generally, organic EL elements including light emitting layers of respective colors of red (R), green (G) and blue (B) are formed and arranged on a substrate as sub-pixels. By causing these organic EL elements to selectively emit light at the desired brightness by using the TFT, a color image is displayed.

In order to manufacture an organic EL display device, it is necessary to form a light emitting layer made of organic light emitting materials that emit respective colors in a predetermined pattern for each organic EL element.

Known methods for forming light emitting layers in a predetermined pattern are vacuum vapor deposition method, inkjet method and laser transfer method. For example, the vacuum vapor deposition method is often used for low molecular organic EL display devices (OLEDs).

In the vacuum vapor deposition method, a mask (also called a "shadow mask") having a predetermined pattern of openings is used. The deposition surface of a substrate having the mask closely fixed thereto is disposed so as to oppose a vapor deposition source. Then, vapor deposition particles (film forming material) from the vapor deposition source are deposited onto the deposition surface through the openings of the mask, whereby a predetermined pattern of a coating film is formed. Vapor deposition is performed for each color of the light emitting layer, which is referred to as "vapor deposition by color".

For example, Patent Documents 1 and 2 describe a method for performing vapor deposition by color in which light emitting layers for respective colors are formed by sequentially moving a mask with respect to a substrate. With such a method, a mask having a size equal to that of a substrate is used, and the mask is fixed so as to cover the deposition surface of the substrate at the time of vapor deposition.

With conventional methods for performing vapor deposition by color as described above, as the substrate becomes larger, the mask needs to be large accordingly. However, when the mask is made large, a gap is likely to appear between the substrate and the mask by the mask being bent or being extended by its own weight. In addition, the size of the gap varies depending on the position of the deposition surface of the substrate. For this reason, it is difficult to perform highly accurate patterning, and it is therefore difficult to achieve high definition due to the occurrence of vapor deposition positions being positionally offset and the occurrence of color mixing.

Also, when the mask is made large, the mask as well as a frame or the like for holding the mask need to be gigantic, which increases the weight and makes handling thereof difficult. As a result, there is a possibility that productivity and safety might be compromised. Also, the vapor deposition device and devices that are used together therewith need to be made gigantic and complex as well, which makes device designing difficult and increases the installation cost.

For the reasons described above, the conventional methods for vapor deposition by color that are described in Patent Documents 1 and 2 are difficult to adapt to large-sized substrates, and it is difficult to perform vapor deposition by color on large-sized substrates such as those having a size exceeding 60 inches on a mass manufacturing level.

Patent Document 3 describes a vapor deposition method for causing vapor deposition particles discharged from a vapor deposition source to adhere to a substrate after causing the vapor deposition particles to pass through a mask opening of a vapor deposition mask while relatively moving the vapor deposition source and the vapor deposition mask with respect to the substrate. With this vapor deposition method, even in the case of large-sized substrates, it is not necessary to increase the size of the vapor deposition mask in accordance with the size of the substrates.

However, because it is necessary to relatively move the vapor deposition mask with respect to the substrate, the substrate and the vapor deposition mask need to be spaced apart from each other. With Patent Document 3, vapor deposition particles that fly from various directions may enter the mask openings of the vapor deposition mask, and therefore the width of the coating film formed on the substrate is wider than the width of the mask opening, resulting in blurring at the edge of the coating film.

Patent Document 4 describes a vapor deposition device including a plurality of nozzles arranged along a first direction, a plurality of slits arranged along the first direction, and a plurality of shielding walls arranged along the first direction between the plurality of nozzles and the plurality of slits. Vapor deposition particles respectively discharged from the plurality of nozzles pass through spaces between the shielding walls and the plurality of slits, and adhere to the substrate traveling in a second direction that is orthogonal to the first direction so as to form a thin film. According to this vapor deposition device, the shielding walls limit the incidence angles of the vapor deposition particles in the first direction entering the slits, and therefore blurring at the edges of a coating film in the first direction formed on the substrate can be reduced.

CITATION LIST

Patent Document

Patent Document 1: JP H8-227276A
Patent Document 2: JP 2000-188179A
Patent Document 3: JP 2004-349101A
Patent Document 4: JP 2010-270397A

DISCLOSURE OF INVENTION

Problem to be Solved by the Invention

In the vapor deposition device of Patent Document 4, a plurality of shielding walls may be positionally offset in the first direction relatively with respect to a plurality of nozzles or a plurality of slits due to a thermal expansion difference resulting from a temperature change, an error in assembly of the vapor deposition device, and the like. If such positional offset occurs, the vapor deposition particles discharged from a nozzle pass through an undesired slit, and therefore there is a problem in that a coating film is not formed at a desired position on a substrate.

It is an object of the present invention to solve the above-described conventional problems, and to stably form a vapor deposition coating film in which edge blurring is suppressed at a desired position on the substrate.

Means for Solving Problem

The vapor deposition device of the present invention is a vapor deposition device that forms a coating film having a predetermined pattern on a substrate, and the vapor deposition device includes a vapor deposition unit and a moving mechanism that moves one of the substrate and the vapor deposition unit relative to the other along a first direction that is orthogonal to a normal line direction of the substrate. The vapor deposition unit includes a vapor deposition source having a plurality of vapor deposition source openings that respectively discharge vapor deposition particles, a limiting unit having a plurality of limiting openings through which the vapor deposition particles discharged from the plurality of vapor deposition source openings respectively pass, and a vapor deposition mask in which a plurality of mask openings are formed only in a plurality of vapor deposition regions where the vapor deposition particles that have respectively passed through the plurality of limiting openings reach. The plurality of vapor deposition regions are arranged along a second direction that is orthogonal to the normal line direction and the first direction with non-vapor deposition regions where the vapor deposition particles do not reach being sandwiched therebetween. Mask openings through which the vapor deposition particles pass are formed at different positions in the first direction from the positions of the non-vapor deposition regions located on a straight line parallel to the second direction, as viewed along the normal line direction.

The vapor deposition method of the present invention is a vapor deposition method including a vapor deposition step of forming a coating film having a predetermined pattern on a substrate by causing vapor deposition particles to adhere onto the substrate, and the vapor deposition step is performed by using the above-described vapor deposition device of the present invention.

An organic EL display device according to the present invention includes a coating film formed by using the above-described vapor deposition method of the present invention as a light emitting layer.

Effects of the Invention

According to the vapor deposition device and the vapor deposition method of the present invention, a plurality of vapor deposition regions are arranged along a second direction with non-vapor deposition regions, where vapor deposition particles do not reach, being sandwiched therebetween, and therefore, even if a limiting unit is positionally offset in the second direction with respect to a vapor deposition source and a vapor deposition mask, a positional offset of a coating film to be formed on the substrate does not occur.

Also, as viewed along the normal line direction of the substrate, mask openings through which vapor deposition particles pass are formed at different positions in the first direction from the positions of non-vapor deposition regions located on a straight line parallel to the second direction, and therefore it is possible to prevent a problem of the coating films not being formed in regions on the substrate corresponding to said non-vapor deposition regions due to the presence of the non-vapor deposition regions.

When vapor deposition particles pass through limiting openings of the limiting unit, the limiting unit selectively captures the vapor deposition particles according to the incidence angles thereof, and therefore only vapor deposition particles having a predetermined incidence angle or less enter mask openings. Accordingly, the maximum incidence angle of the vapor deposition particles with respect to the substrate is reduced, and therefore blurring that occurs at the edge of the coating film formed on the substrate can be suppressed.

An organic EL display device according to the present invention includes a light emitting layer formed by using the above-described vapor deposition method, and therefore it is possible to obtain a high quality organic EL display device with good yield.

BRIEF DESCRIPTION OF DRAWINGS

FIG. 21 is a see-through plan view showing how a stripe-shaped coating film is formed on a substrate using the vapor deposition device shown in FIG. 18.

FIG. 22 is a plan view of a limiting unit to be used in a vapor deposition device according to Embodiment 3 of the present invention.

FIG. 23 is a plan view of a vapor deposition mask to be used in the vapor deposition device according to Embodiment 3 of the present invention on which the limiting unit shown in FIG. 22 is mounted.

FIG. 24 is a plan view of another limiting unit to be used in the vapor deposition device according to Embodiment 3 of the present invention.

FIG. 25 is a plan view of a vapor deposition mask to be used in the vapor deposition device according to Embodiment 3 of the present invention on which the limiting unit shown in FIG. 24 is mounted.

DESCRIPTION OF THE INVENTION

Figure 1:
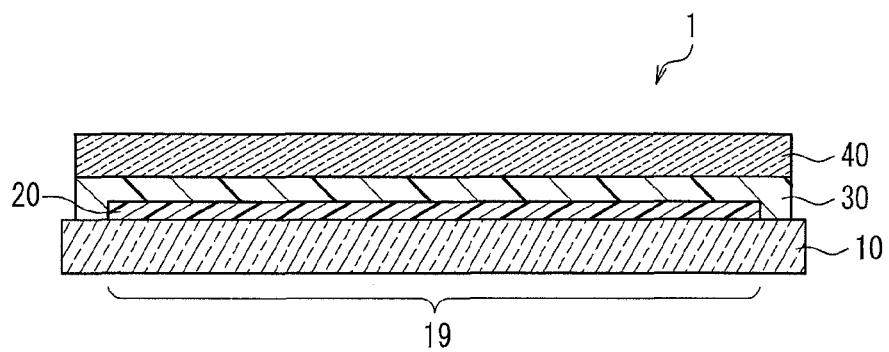
FIG. 1 is a cross-sectional view showing a schematic configuration of an organic EL display device.

The vapor deposition device of the present invention is a vapor deposition device that forms a coating film having a predetermined pattern on a substrate, and the vapor deposition device includes a vapor deposition unit and a moving mechanism that moves one of the substrate and the vapor deposition unit relative to the other along a first direction that is orthogonal to a normal line direction of the substrate. The vapor deposition unit includes a vapor deposition source having a plurality of vapor deposition source openings that respectively discharge vapor deposition particles, a limiting unit having a plurality of limiting openings through which the vapor deposition particles discharged from the plurality of vapor deposition source openings respectively pass, and a vapor deposition mask in which a plurality of mask openings are formed only in a plurality of vapor deposition regions where the vapor deposition particles that have respectively passed through the plurality of limiting openings reach. The plurality of vapor deposition regions are arranged along a second direction that is orthogonal to the normal line direction and the first direction with non-vapor deposition regions where the vapor deposition particles do not reach being sandwiched therebetween. Mask openings through which the vapor deposition particles pass are formed at different positions in the first direction from the positions of the non-vapor deposition regions located on a straight line parallel to the second direction, as viewed along the normal line direction.

In the vapor deposition device of the present invention, it is preferable that the plurality of vapor deposition regions are arranged along a plurality of straight lines that are parallel to the second direction and are located at different positions in the first direction, as viewed along the normal line direction. Accordingly, the degree of freedom for each arrangement of the plurality of vapor deposition source openings, the plurality of limiting openings, and the plurality of mask openings is improved.

It is preferable that the plurality of vapor deposition regions are arranged in a staggered arrangement along two straight lines that are parallel to the second direction and are located at different positions in the first direction, as viewed along the normal line direction. Accordingly, it is possible to realize the vapor deposition device of the present invention by respectively arranging the plurality of vapor deposition source openings, the plurality of limiting openings, and the plurality of mask openings efficiently.

In the vapor deposition device of the present invention, the non-vapor deposition regions may be slanted with respect to the first direction and the second direction, as viewed along the normal line direction. Accordingly, it is possible to arrange the plurality of vapor deposition source openings, the plurality of limiting openings, and the plurality of vapor deposition regions along a straight line parallel to the second direction. Therefore, it is possible to reduce the sizes in the first direction and the weights of the vapor deposition source, the limiting unit, and the vapor deposition mask. Note that, in the present invention, a non-vapor deposition region "is slanted" with respect to the first direction and the second direction means that a direction in which the non-vapor deposition region extends (that is, the longitudinal direction of the non-vapor deposition region) is not perpendicular or parallel to the first direction and the second direction.

In the vapor deposition device of the present invention, it is preferable that a shared coating film is formed by overlaying vapor deposition particles that have passed through a plurality of mask openings arranged at different positions in the first direction. Accordingly, the utilization efficiency of the vapor deposition material is improved and throughput at the time of mass production is improved. Also, it is possible to form a coating film having a uniform thickness over a wide range of the substrate in the second direction.

In the vapor deposition device of the present invention, it is preferable that the width of the vapor deposition region in the second direction is larger than the width of a region in the second direction where mask openings are present in the vapor deposition region. Accordingly, it is possible to prevent a situation in which a coating film is not formed at a desired position due to the limiting unit being positionally offset in the second direction with respect to the vapor deposition source and the vapor deposition mask.

In the vapor deposition method of the present invention, it is preferable that the coating film is a light emitting layer for an organic EL element.

Hereinafter, the present invention will be described in detail by showing preferred embodiments. It should be noted, however, that the present invention is not limited to the following embodiments. For the sake of convenience of the description, the drawings referred to hereinafter show only the principal members required to describe the present invention in simplified form among the constituent members of the embodiments of the present invention. Accordingly, the present invention may include optional constituent members that are not shown in the following drawings. Also, the dimensions of the members in the drawings do not faithfully represent the actual dimensions or dimensional proportions of the constituent members.

(Configuration of Organic EL Display Device)

An example of an organic EL display device that can be manufactured by applying the present invention will be described. This organic EL display device is a bottom emission type organic EL display device in which light is extracted from the TFT substrate side and that displays full color images by controlling light emission of red (R), green (G) and blue (B) pixels (sub-pixels).

First, the overall configuration of the organic EL display device will be described below.

Figure 2:
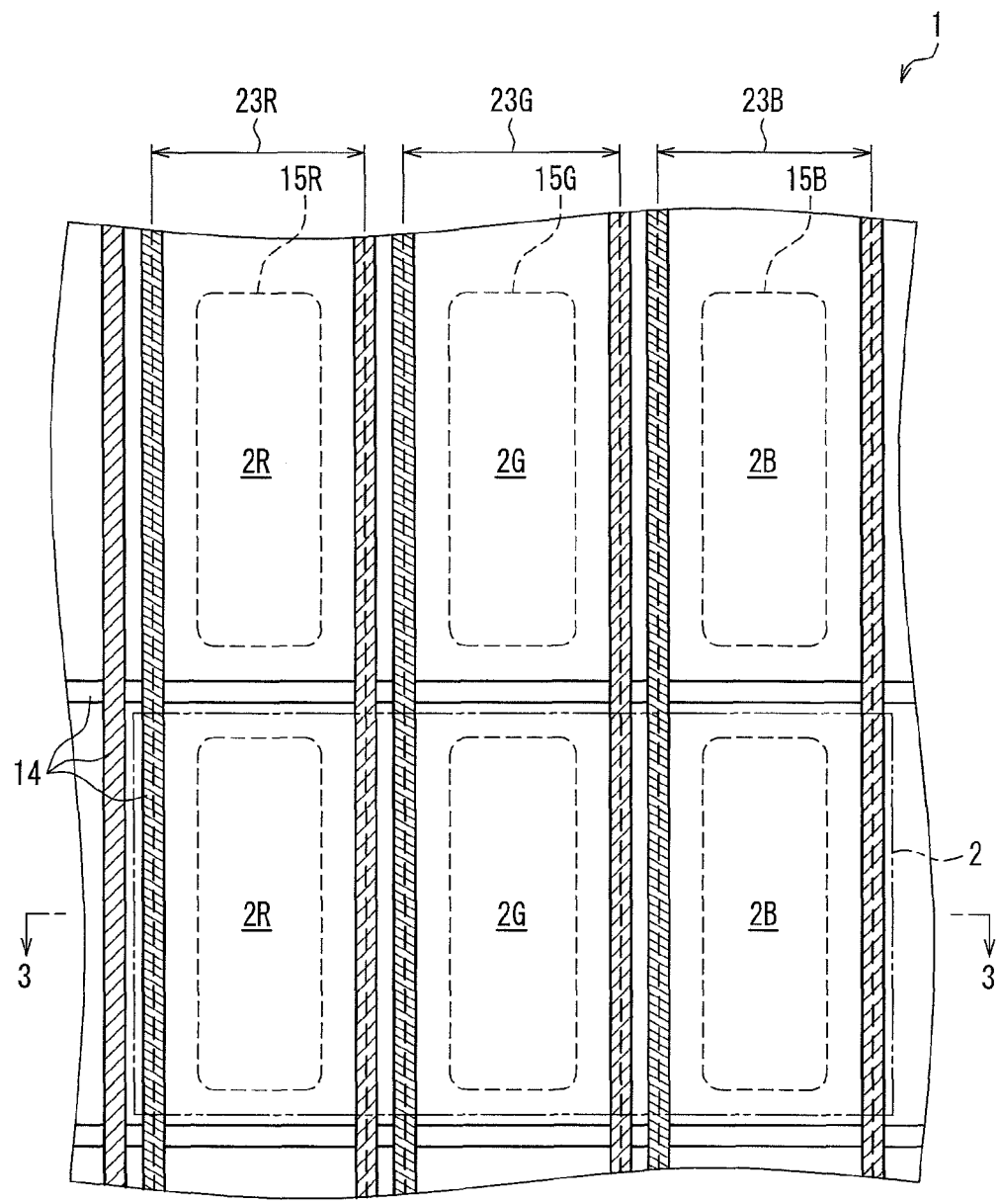
FIG. 2 is a plan view showing a configuration of pixels that constitute the organic EL display device shown in FIG. 1.
Figure 3:
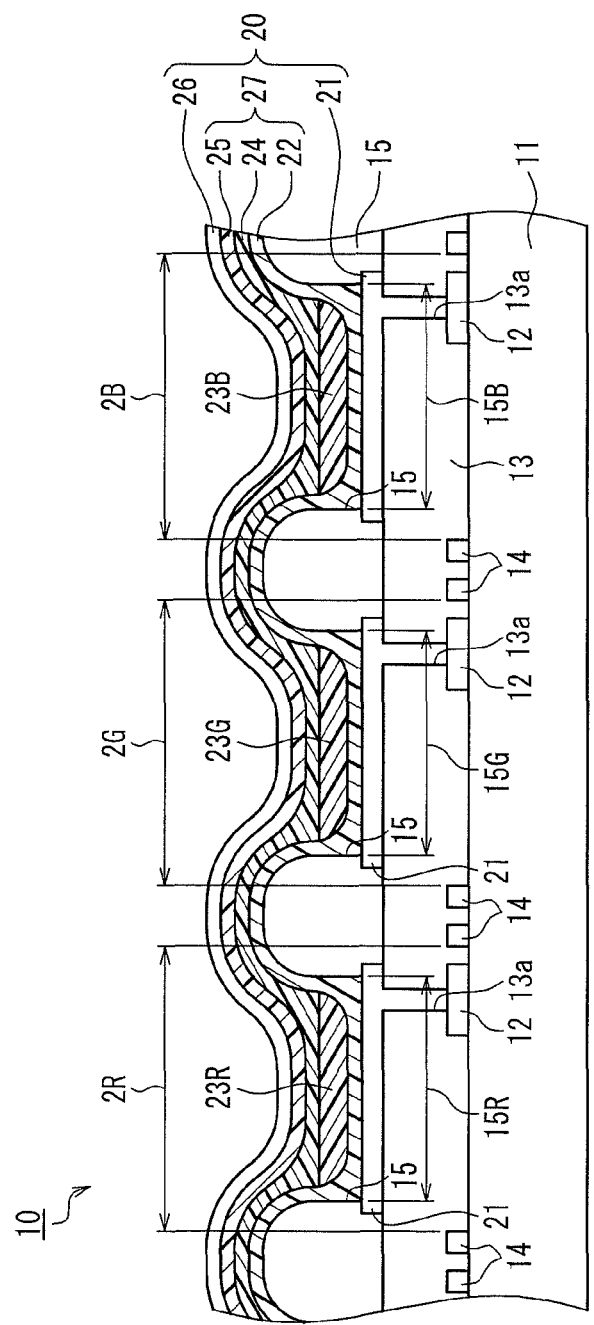
FIG. 3 is a cross-sectional view of a TFT substrate that constitutes the organic EL display device taken along the line 3-3 of FIG. 2.

FIG. 1 is a cross-sectional view showing a schematic configuration of the organic EL display device. FIG. 2 is a plan view showing a configuration of pixels that constitute the organic EL display device shown in FIG. 1. FIG. 3 is a cross-sectional view of a TFT substrate that constitutes the organic EL display device, taken along the line 3-3 of FIG. 2.

As shown in FIG. 1, the organic EL display device 1 has a configuration in which, on a TFT substrate 10 provided with a TFT 12 (see FIG. 3), an organic EL element 20 connected to the TFT 12, an adhesive layer 30 and a sealing substrate 40 are provided in this order. A display region 19 in which images are displayed is located in the center of the organic EL display device 1, and the organic EL element 20 is disposed within the display region 19.

The organic EL element 20 is enclosed between a pair of substrates, namely, the TFT substrate 10 and the sealing substrate 40, by the TFT substrate 10 having the organic EL element 20 laminated thereon being bonded to the sealing substrate 40 with the use of the adhesive layer 30. By the organic EL element 20 being enclosed between the TFT substrate 10 and the sealing substrate 40 as described above, oxygen and moisture are prevented from entering the organic EL element 20 from the outside.

As shown in FIG. 3, the TFT substrate 10 includes, as a support substrate, a transparent insulating substrate 11 such as a glass substrate, for example. In the case of a top emission type organic EL display device, however, the insulating substrate 11 is not necessarily transparent.

As shown in FIG. 2, on the insulating substrate 11, a plurality of wires 14 are provided that include a plurality of gate lines provided in the horizontal direction and a plurality of signal lines intersecting the gate lines and provided in the vertical direction. A gate line driving circuit (not shown) that drives the gate lines is connected to the gate lines, and a signal line driving circuit (not shown) that drives the signal lines are connected to the signal lines. On the insulating substrate 11, red (R), green (G) and blue (B) sub-pixels 2R, 2G and 2B made of the organic EL element 20 are disposed in a matrix in their respective regions surrounded by the wires 14.

The sub-pixels 2R emit red light, the sub-pixels 2G emit green light, and the sub-pixels 2B emit blue light. Sub-pixels of the same color are disposed in a column direction (up-down direction in FIG. 2) and a repeating unit consisting of sub-pixels 2R, 2G and 2B is repeatedly disposed in a row direction (right-left direction in FIG. 2). The sub-pixels 2R, 2G and 2B constituting a repeating unit in the row direction constitute a pixel 2 (specifically, a single pixel).

The sub-pixels 2R, 2G and 2B respectively include light emitting layers 23R, 23G and 23B that emit respective colors. The light emitting layers 23R, 23G and 23B are provided to extend in stripes in the column direction (up-down direction in FIG. 2).

A configuration of the TFT substrate 10 will be described.

As shown in FIG. 3, the TFT substrate 10 includes, on the transparent insulating substrate 11 such as a glass substrate, the TFT 12 (switching element), the wires 14, an inter-layer film 13 (inter-layer insulating film, planarized film), an edge cover 15, and so on.

The TFT 12 functions as a switching element that controls light emission of the sub-pixels 2R, 2G and 2B, and is provided for each of the sub-pixels 2R, 2G and 2B. The TFT 12 is connected to the wires 14.

The inter-layer film 13 also functions as a planarized film, and is laminated over the display region 19 of the insulating substrate 11 so as to cover the TFT 12 and the wires 14.

A first electrode 21 is formed on the inter-layer film 13. The first electrode 21 is electrically connected to the TFT 12 via a contact hole 13a formed in the inter-layer film 13.

The edge cover 15 is formed on the inter-layer film 13 so as to cover pattern ends of the first electrode 21. The edge cover 15 is an insulating layer for preventing short-circuiting between the first electrode 21 and a second electrode 26 that constitute the organic EL element 20 caused by an organic EL layer 27 becoming thin or the occurrence of electric field concentration at the pattern ends of the first electrode 21.

The edge cover 15 has openings 15R, 15G and 15B for the sub-pixels 2R, 2G and 2B. The openings 15R, 15G and 15B of the edge cover 15 serve as light emitting regions of the sub-pixels 2R, 2G and 2B. To rephrase, the sub-pixels 2R, 2G and 2B are partitioned by the edge cover 15 that is insulative. The edge cover 15 also functions as an element separation film.

The organic EL element 20 will be described.

The organic EL element 20 is a light emitting element capable of emitting highly bright light by low voltage direct current driving, and includes the first electrode 21, the organic EL layer 27 and the second electrode 26 in this order.

The first electrode 21 is a layer having a function of injecting (supplying) holes into the organic EL layer 27. As described above, the first electrode 21 is connected to the TFT 12 via the contact hole 13a.

As shown in FIG. 3, the organic EL layer 27 includes, between the first electrode 21 and the second electrode 26, a hole injection and transport layer 22, the light emitting layers 23R, 23G and 23B, an electron transport layer 24 and an electron injection layer 25 in this order from the first electrode 21 side.

In the present embodiment, the first electrode 21 serves as a positive electrode and the second electrode 26 serves as a negative electrode, but the first electrode 21 may serve as a negative electrode and the second electrode 26 may serve as a positive electrode. In this case, the order of the layers constituting the organic EL layer 27 is reversed.

The hole injection and transport layer 22 functions both as a hole injection layer and a hole transport layer. The hole injection layer is a layer having a function of enhancing the efficiency of injecting holes into the light emitting layers 23R, 23G and 23B. The hole transport layer is a layer having a function of enhancing the efficiency of transporting holes to the light emitting layers 23R, 23G and 23B. The hole injection and transport layer 22 is formed uniformly over the display region 19 in the TFT substrate 10 so as to cover the first electrode 21 and the edge cover 15.

In the present embodiment, the hole injection and transport layer 22 in which a hole injection layer and a hole transport layer are integrated together is provided, but the present invention is not limited thereto, and the hole injection layer and the hole transport layer may be formed as independent layers.

On the hole injection and transport layer 22, the light emitting layers 23R, 23G and 23B are formed correspondingly to the columns of the sub-pixels 2R, 2G and 2B so as to cover the openings 15R, 15G and 15B of the edge cover 15, respectively. The light emitting layers 23R, 23G and 23B are layers having a function of emitting light by recombining holes injected from the first electrode 21 side and electrons injected from the second electrode 26 side. The light emitting layers 23R, 23G and 23B each contain a material having a high light-emission efficiency such as a low-molecular fluorescent dye or a metal complex.

The electron transport layer 24 is a layer having a function of enhancing the efficiency of transporting electrons from the second electrode 26 to the light emitting layers 23R, 23G and 23B.

The electron injection layer 25 is a layer having a function of enhancing the efficiency of injecting electrons from the second electrode 26 to the light emitting layers 23R, 23G and 23B.

The electron transport layer 24 is formed uniformly over the display region 19 in the TFT substrate 10 such that it is on the light emitting layers 23R, 23G and 23B and the hole injection and transport layer 22 so as to cover the light emitting layers 23R, 23G and 23B and the hole injection and transport layer 22. Likewise, the electron injection layer 25 is formed uniformly over the display region 19 in the TFT substrate 10 such that it is on the electron transport layer 24 so as to cover the electron transport layer 24.

In the present embodiment, the electron transport layer 24 and the electron injection layer 25 are provided as independent layers, but the present invention is not limited thereto, and they may be provided as a single layer (specifically, an electron transport and injection layer) in which the electron transport layer 24 and the electron injection layer 25 are integrated together.

The second electrode 26 is a layer having a function of injecting electrons into the organic EL layer 27. The second electrode 26 is formed uniformly over the display region 19 in the TFT substrate 10 such that it is on the electron injection layer 25 so as to cover the electron injection layer 25.

An organic layer other than the light emitting layers 23R, 23G and 23B is not essential to the organic EL layer 27, and may be selected or omitted according to the characteristics required of the organic EL element 20. The organic EL layer 27 may further include a carrier blocking layer if necessary. By adding a hole blocking layer serving as a carrier blocking layer between the electron transport layer 24 and the light emitting layer 23R, 23G, 23B, for example, it is possible to prevent holes from escaping to the electron transport layer 24, whereby light-emission efficiency can be improved.

(Manufacturing Method for Organic EL Display Device)

A method for manufacturing an organic EL display device 1 will be described below.

Figure 4:
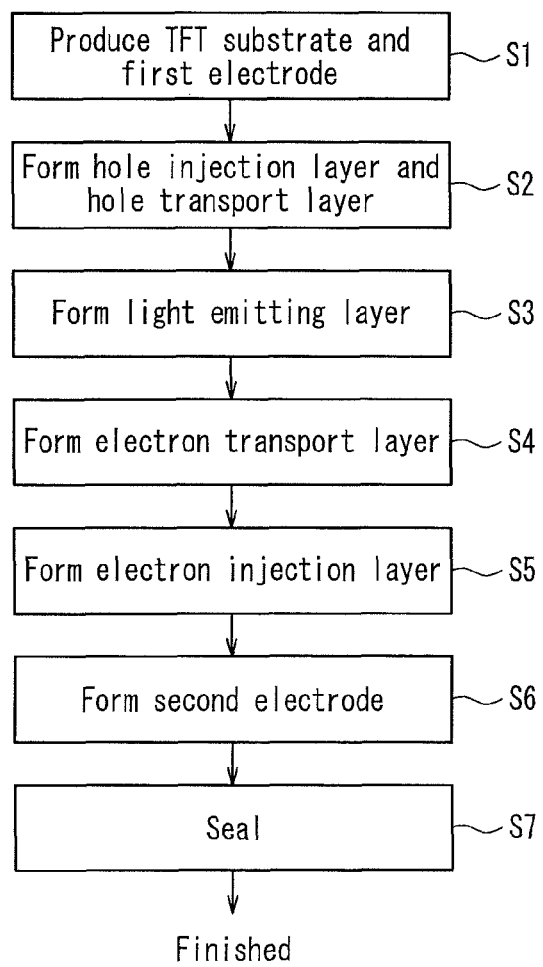
FIG. 4 is a flowchart illustrating the steps of a process for manufacturing an organic EL display device in order.

FIG. 4 is a flowchart illustrating the steps of a process for manufacturing the above-described organic EL display device 1 in order.

As shown in FIG. 4, the method for manufacturing an organic EL display device 1 according to the present embodiment includes, for example, a TFT substrate/first electrode producing step S1, a hole injection layer/hole transport layer forming step S2, a light emitting layer forming step S3, an electron transport layer forming step S4, an electron injection layer forming step S5, a second electrode forming step S6 and a sealing step S7 in this order.

Each step of FIG. 4 will be described below. It should be noted, however, that the dimensions, materials and shapes of the constituent elements described below are merely examples, and the present invention is not limited thereto. Also, in the present embodiment, the first electrode 21 is used as a positive electrode and the second electrode 26 is used as a negative electrode, but in the case where the first electrode 21 is used as a negative electrode and the second electrode 26 is used as a positive electrode, the order of the layers laminated in the organic EL layer is reversed from that discussed below. Likewise, the materials for constituting the first electrode 21 and the second electrode 26 are also reversed from those discussed below.

First, a TFT 12, wires 14 and the like are formed on an insulating substrate 11 by a known method. As the insulating substrate 11, for example, a transparent glass substrate, plastic substrate or the like can be used. As an example, a rectangular glass plate having a thickness of about 1 mm and longitudinal and transverse dimensions of 500×400 mm can be used as the insulating substrate 11.

Next, a photosensitive resin is applied onto the insulating substrate 11 so as to cover the TFT 12 and the wires 14, and patterning is performed using a photolithography technique to form an inter-layer film 13. As a material for the inter-layer film 13, for example, an insulating material such as acrylic resin or polyimide resin can be used. Generally, polyimide resin is not transparent but colored. For this reason, when manufacturing a bottom emission type organic EL display device 1 as shown FIG. 3, it is preferable to use a transparent resin such as acrylic resin for the inter-layer film 13. There is no particular limitation on the thickness of the inter-layer film 13 as long as irregularities in the upper surface of the TFT 12 can be eliminated. As an example, an inter-layer film 13 having a thickness of about 2 μm can be formed by using acrylic resin.

Next, contact holes 13a for electrically connecting the first electrode 21 to the TFT 12 are formed in the inter-layer film 13.

Next, a first electrode 21 is formed on the inter-layer film 13. Specifically, a conductive film (electrode film) is formed on the inter-layer film 13. Next, a photoresist is applied onto the conductive film and patterning is performed by using a photolithography technique, after which the conductive film is etched using ferric chloride as an etching solution. After that, the photoresist is stripped off using a resist stripping solution, and the substrate is washed. A first electrode 21 in a matrix is thereby obtained on the inter-layer film 13.

Examples of conductive film-forming materials that can be used for the first electrode 21 include transparent conductive materials such as ITO (indium tin oxide), IZO (indium zinc oxide) and gallium-added zinc oxide (GZO); and metal materials such as gold (Au), nickel (Ni) and platinum (Pt).

As the method for laminating conductive films, it is possible to use a sputtering method, a vacuum vapor deposition method, a CVD (chemical vapor deposition) method, a plasma CVD method, a printing method or the like can be used.

As an example, a first electrode 21 having a thickness of about 100 nm can be formed by a sputtering method using ITO.

Next, an edge cover 15 having a predetermined pattern is formed. The edge cover 15 can be formed by, for example, patterning performed in the same manner as performed for the inter-layer film 13, using the same insulating materials as those listed for the inter-layer film 13. As an example, an edge cover 15 having a thickness of about 1 μm can be formed using acrylic resin.

Through the above processing, the TFT substrate 10 and the first electrode 21 are produced (Step S1).

Next, the TFT substrate 10 that has undergone step S1 is baked under reduced pressure for the purpose of dehydration and then subjected to an oxygen plasma treatment in order to wash the surface of the first electrode 21.

Next, on the TFT substrate 10, a hole injection layer and a hole transport layer (in the present embodiment, a hole injection and transport layer 22) is formed over the display region 19 in the TFT substrate 10 by a vapor deposition method (S2).

Specifically, an open mask having an opening corresponding to the entire display region 19 is closely fixed to the TFT substrate 10. Materials for forming a hole injection layer and a hole transport layer are deposited over the display region 19 in the TFT substrate 10 through the opening of the open mask while the TFT substrate 10 and the open mask are rotated together.

As noted above, the hole injection layer and the hole transport layer may be integrated into a single layer, or may be independent layers. Each layer has a thickness of, for example, 10 to 100 nm.

Examples of materials for the hole injection layer and the hole transport layer include benzine, styryl amine, triphenyl amine, porphyrin, triazole, imidazole, oxadiazole, polyarylalkane, phenylene diamine, arylamine, oxazole, anthracene, fluorenone, hydrazone, stilbene, triphenylene, azatriphenylene and derivatives thereof, heterocyclic conjugated monomers, oligomers or polymers, such as polysilane-based compounds, vinylcarbazole-based compounds, thiophene-based compounds, aniline-based compounds and the like.

As an example, a hole injection and transport layer 22 having a thickness of 30 nm can be formed using 4,4'-bis[N-(1-naphthyl)-N-phenylamino]biphenyl (α-NPD).

Next, on the hole injection and transport layer 22, light emitting layers 23R, 23G and 23B are formed in stripes so as to cover openings 15R, 15G and 15B in the edge cover 15 (S3). The light emitting layers 23R, 23G and 23B are deposited such that respective colors, namely, red, green and blue are applied to corresponding predetermined regions (vapor deposition by color).

As materials for the light emitting layers 23R, 23G and 23B, materials having a high light-emission efficiency such as low-molecular fluorescent dyes or metal complexes can be used. Examples thereof include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, tris(8-quinolinolato)aluminum complex, bis(benzoquinolinolato) beryllium complex, tri(dibenzoylmethyl)phenanthroline europium complex, ditolyl vinyl biphenyl and the like.

The light emitting layers 23R, 23G and 23B may be constituted only by the above-described organic light emitting material, or may include a hole transport layer material, an electron transport layer material, additives (donor, acceptor, and the like), a luminescent dopant, and the like. Also, a configuration may be adopted in which these materials are dispersed in a polymeric material (resin for binding) or an inorganic material. It is preferable that luminescent dopants are dispersed in host from the view are tilted of improving light-emission efficiency and achieving a long service life.

The light emitting layers 23R, 23G and 23B can have a thickness of, for example, 10 to 100 nm.

The vapor deposition method and the deposition device of the present invention can be used particularly suitably in vapor deposition by color for forming light emitting layers 23R, 23G and 23B. The method for forming light emitting layers 23R, 23G and 23B using the present invention will be described later in detail.

Next, an electron transport layer 24 is formed over the display region 19 in the TFT substrate 10 so as to cover the hole injection and transport layer 22 and the light emitting layers 23R, 23G and 23B by a vapor deposition method (S4). The electron transport layer 24 can be formed in the same manner as in the hole injection layer/hole transport layer forming step (S2) described above.

Next, an electron injection layer 25 is formed over the display region 19 in the TFT substrate 10 so as to cover the electron transport layer 24 by a vapor deposition method (S5). The electron injection layer 25 can be formed in the same manner as in the hole injection layer/hole transport layer forming step (S2) described above.

Examples of materials for the electron transport layer 24 and the electron injection layer 25 include quinoline, perylene, phenanthroline, bisstyryl, pyrazine, triazole, oxazole, oxadiazole, fluorenone, and derivatives and metal complexes thereof, LiF (lithium fluoride) and the like.

As noted above, the electron transport layer 24 and the electron injection layer 25 may be formed as a single layer in which these layers are integrated together, or may be formed as independent layers. Each layer has a thickness of, for example, 1 to 100 nm. The total thickness of the electron transport layer 24 and the electron injection layer 25 is, for example, 20 to 200 nm.

As an example, an electron transport layer 24 having a thickness of 30 nm can be formed using Alq (tris(8-hydroxyquinoline)aluminum), and an electron injection layer 25 having a thickness of 1 nm can be formed using LiF (lithium fluoride).

Next, a second electrode 26 is formed over the display region 19 in the TFT substrate 10 so as to cover the electron injection layer 25 by a vapor deposition method (S6). The second electrode 26 can be formed in the same manner as in the hole injection layer/hole transport layer forming step (S2) described above. The material (electrode material) for the second electrode 26 is preferably a metal having a small work function, or the like. Examples of such electrode materials include magnesium alloy (MgAg and the like), aluminum alloy (AlLi, AlCa, AlMg and the like), metal calcium, and the like. The second electrode 26 has a thickness of, for example, 50 to 100 nm. As an example, a second electrode 26 having a thickness of 50 nm can be formed using aluminum.

On the second electrode 26, a protective film may be formed so as to cover the second electrode 26, in order to prevent oxygen and moisture from entering the organic EL element 20 from the outside. As the material for the protective film, an insulating or conductive material can be used. Examples thereof include silicon nitride and silicon oxide. The protective film has a thickness of, for example, 100 to 1000 nm.

Through the above processing, the organic EL element 20 including the first electrode 21, the organic EL layer 27 and the second electrode 26 can be formed on the TFT substrate 10.

Next, as shown in FIG. 1, the TFT substrate 10 having the organic EL element 20 formed thereon is bonded to a sealing substrate 40 by using an adhesive layer 30 so as to enclose the organic EL element 20. As the sealing substrate 40, for example, an insulating substrate, such as a glass substrate or a plastic substrate, having a thickness of 0.4 to 1.1 mm can be used.

In this manner, an organic EL display device 1 is obtained.

In the organic EL display device 1, when the TFT 12 is turned on by input of signals from the wires 14, holes are injected from the first electrode 21 into the organic EL layer 27. On the other hand, electrons are injected from the second electrode 26 into the organic EL layer 27. The holes and the electrons are recombined in the light emitting layers 23R, 23G and 23B and emit predetermined color light when deactivating energy. By controlling emitting brightness of each of the sub-pixels 2R, 2G and 2B, a predetermined image can be displayed on the display region 19.

Hereinafter, step S3, which is the step of forming light emitting layers 23R, 23G and 23B by vapor deposition by color, will be described.

Embodiment 1

Basic Configuration of Vapor Deposition Device

Figure 5:
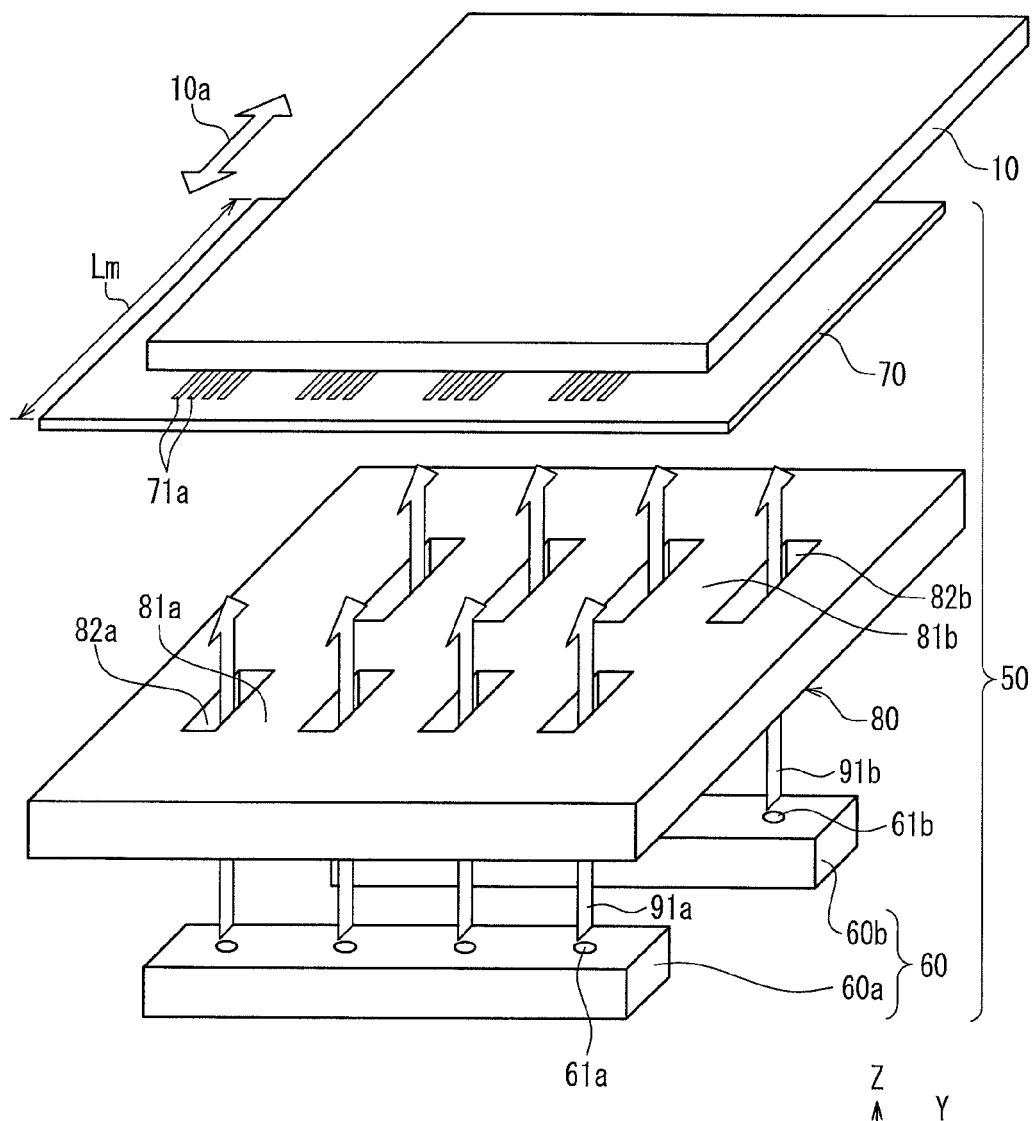
FIG. 5 is a perspective view showing the basic configuration of a vapor deposition device according to Embodiment 1 of the present invention.
Figure 6:
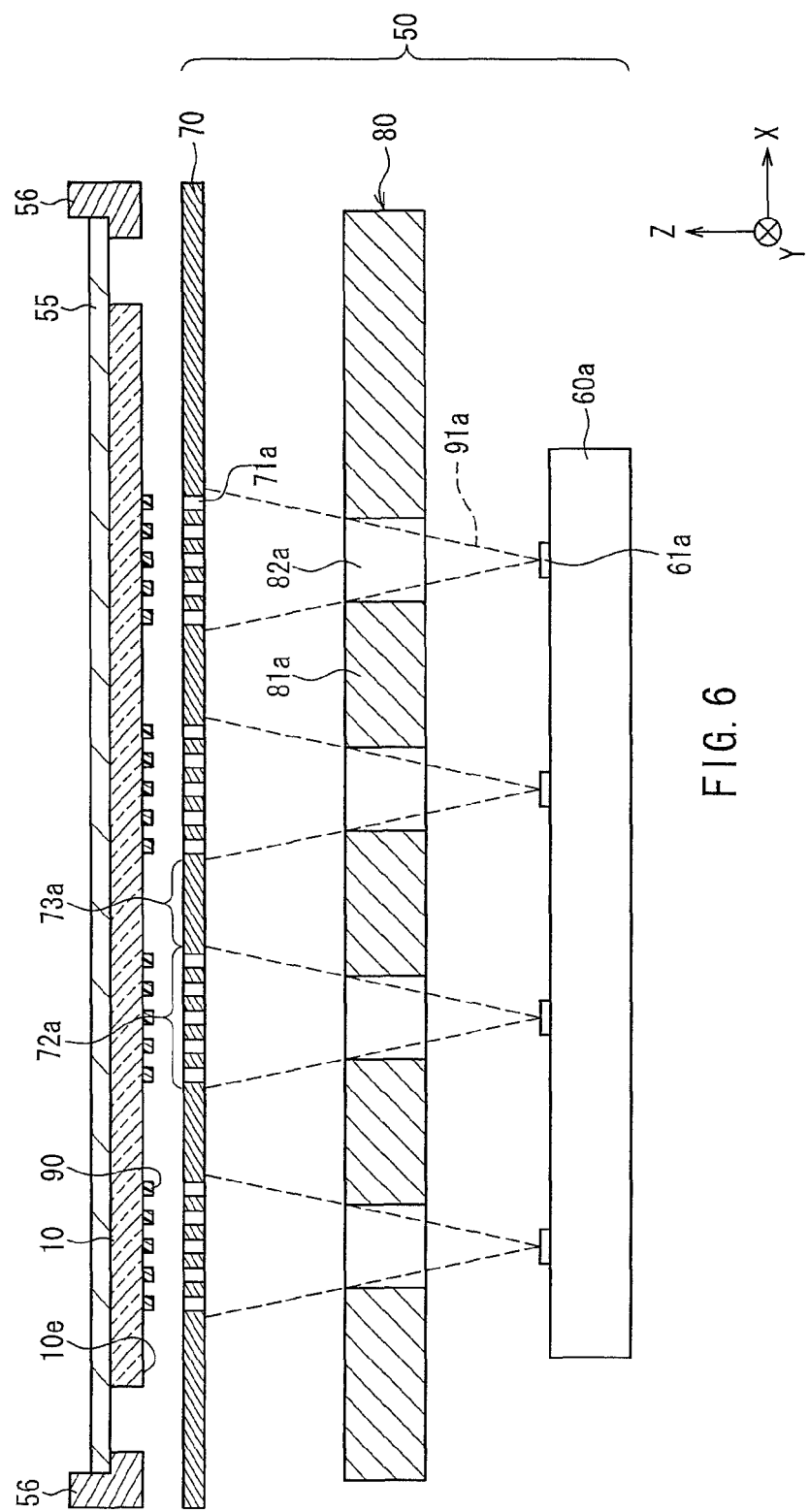
FIG. 6 is a front cross-sectional view of the vapor deposition device shown in FIG. 5, along a plane that is perpendicular to the traveling direction of the substrate and passes across first vapor deposition source.
Figure 7:
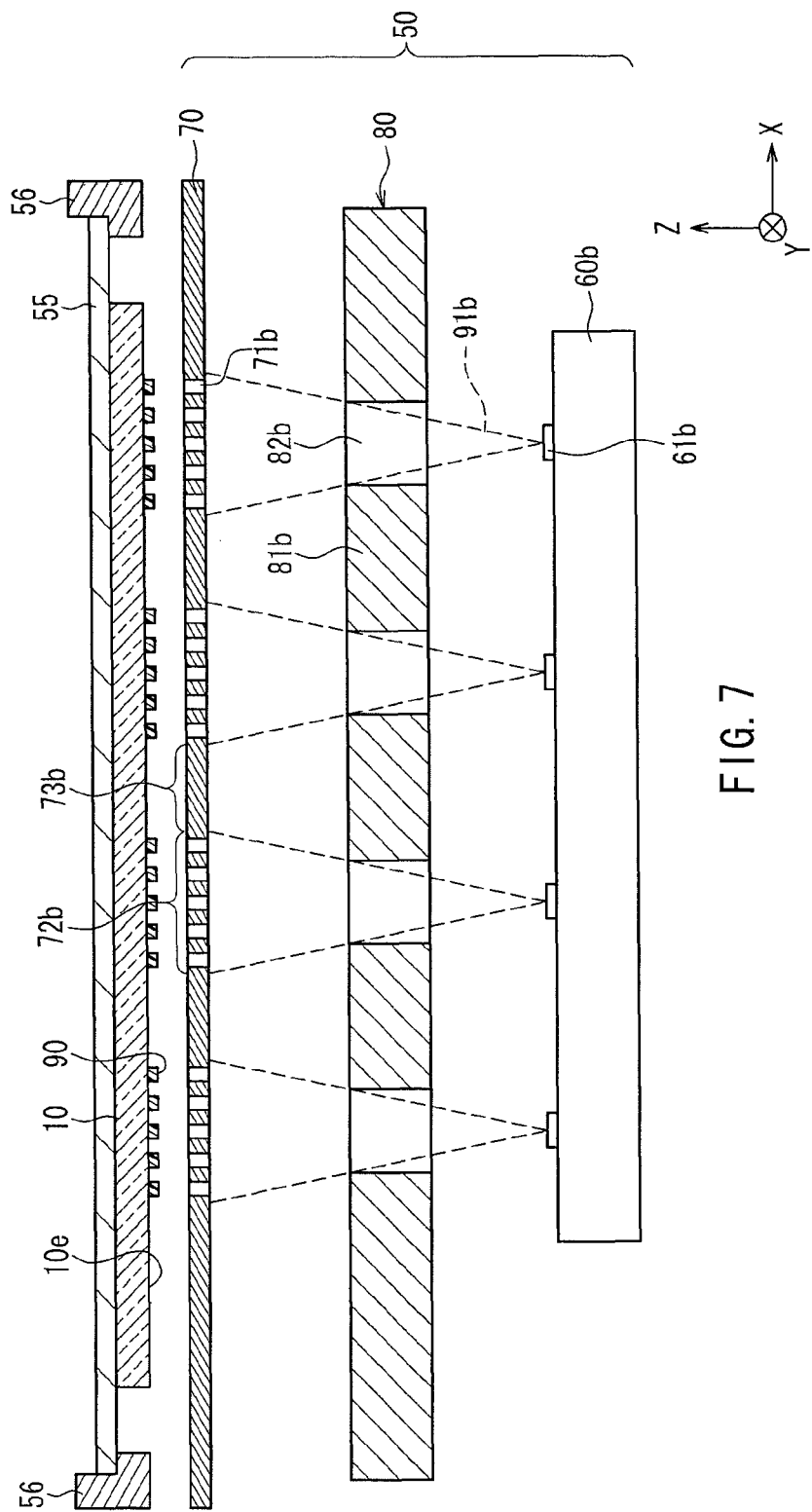
FIG. 7 is a front cross-sectional view of the vapor deposition device shown in FIG. 5, along a plane perpendicular to the traveling direction of the substrate and passing across the second vapor deposition source.

FIG. 5 is a perspective view showing the basic configuration of the vapor deposition device according to Embodiment 1 of the present invention. FIG. 6 is a front cross-sectional view of the vapor deposition device shown in FIG. 5, along a plane passing across a first vapor deposition source 60a. FIG. 7 is a front cross-sectional view of the vapor deposition device shown in FIG. 5, along a plane passing across the second vapor deposition source 60b.

A vapor deposition source 60, a vapor deposition mask 70, and a limiting unit 80 disposed therebetween constitute a vapor deposition unit 50. The substrate 10 moves along an arrow 10a at a constant speed with respect to the vapor deposition mask 70 on the opposite side from the vapor deposition source 60. For the sake of convenience of the description given below, an XYZ orthogonal coordinate system is set in which a horizontal axis parallel to the movement direction (first direction) 10a of the substrate 10 is defined as the Y axis, a horizontal axis perpendicular to the Y axis is defined as the X axis, and a vertical axis perpendicular to the X axis and the Y axis is defined as the Z axis. The Z axis is parallel to the normal line direction of the deposition surface 10e of the substrate 10. To facilitate the description, the side to which the arrow indicating the Z axis are tilted (the upper side of FIGS. 6 and 7) is referred to as the "upper side".

The vapor deposition source 60 has a first vapor deposition source 60a and a second vapor deposition source 60b. The first vapor deposition source 60a and the second vapor deposition source 60b respectively have a plurality of first vapor deposition source openings 61a and a plurality of second vapor deposition source openings 61b, in their upper surfaces (that is, the surface opposing the vapor deposition mask 70). The plurality of first vapor deposition source openings 61a and the plurality of second vapor deposition source openings 61b are arranged at different positions in the Y axis direction, and are arranged at a fixed pitch along a straight line parallel to the X axis direction (second direction). The pitches of the plurality of first vapor deposition source openings 61a in the X axis direction and the pitches of the plurality of second vapor deposition source openings 61b in the X axis direction are the same. The positions of the plurality of first vapor deposition source openings 61a in the X axis direction are positionally offset by half a pitch thereof in the X axis direction, with respect to the positions of the plurality of second vapor deposition source openings 61b in the X axis direction. Each of the vapor deposition source openings 61a and 61b has a nozzle shape that is upwardly open parallel to the Z axis. The first vapor deposition source openings 61a and the second vapor deposition source openings 61b discharge vapor deposition particles that serve as materials for a coating film 90 toward the vapor deposition mask 70. Although vapor deposition particles discharged from the first vapor deposition source openings 61a are the same as vapor deposition particles discharged from the second vapor deposition source openings 61b in the present embodiment, the vapor deposition particles discharged from the first vapor deposition source openings 61a are referred to as "first vapor deposition particles 91a" and the vapor deposition particles discharged from the second vapor deposition source openings 61b are referred to as "second vapor deposition particles 91b" to distinguish therebetween.

Figure 8:
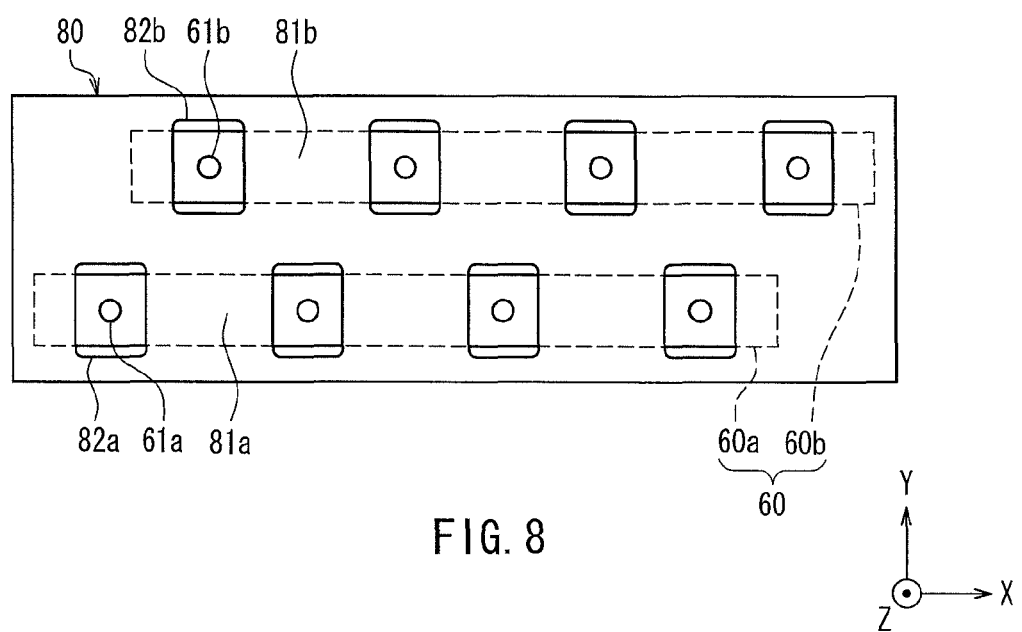
FIG. 8 is a plan view of a limiting unit to be used in the vapor deposition device shown in FIG. 5.

The limiting unit 80 is disposed above the vapor deposition source 60. FIG. 8 is a plan view of the limiting unit 80. The vapor deposition source 60 disposed below the limiting unit 80 is also shown in FIG. 8. A plurality of limiting openings, which are through holes respectively penetrating the limiting unit 80 in the Z axis direction, are formed in the limiting unit 80. The opening shape of the limiting opening is substantially a rectangle whose longitudinal direction is parallel to the Y axis. The plurality of limiting openings include a plurality of first limiting openings 82a disposed along a straight line parallel to the X axis direction at the same pitch as that of the plurality of first vapor deposition source openings 61a, and a plurality of second limiting openings 82b disposed along another straight line parallel to the X axis direction at the same pitch as that of the plurality of second vapor deposition source openings 61b. As can be easily understood from FIG. 8, as viewed in a direction parallel to the Z axis, the plurality of first vapor deposition sources 60a and the plurality of second vapor deposition sources 60b are arranged in a staggered arrangement, and similarly, the plurality of first limiting openings 82a and the plurality of second limiting openings 82b also are arranged in a staggered arrangement.

The first limiting openings 82a neighboring in the X axis direction are separated by a first limiting portion 81a (see FIG. 6), and the second limiting openings 82b neighboring in the X axis direction are separated by a second limiting portion 81b (see FIG. 7). In the present embodiment, one first vapor deposition source opening 61a is disposed at the central point between first limiting portions 81a neighboring in the X axis direction. Also, one second vapor deposition source opening 61b is disposed at the central point between second limiting portions 81b neighboring in the X axis direction. As a result, the plurality of first limiting openings 82a correspond one-to-one to the plurality of first vapor deposition source openings 61a, and each of the plurality of first limiting openings 82a is disposed above the corresponding first vapor deposition source opening 61a. Similarly, the plurality of second limiting openings 82b correspond one-to-one to the plurality of second vapor deposition source openings 61b, and each of the plurality of second limiting openings 82b is disposed above the corresponding second vapor deposition source opening 61b.

However, the present invention is not limited to this, and a plurality of first limiting openings 82a may be configured so as to correspond to one first vapor deposition source opening 61a. Alternatively, one first limiting opening 82a may be configured so as to correspond to a plurality of first vapor deposition source openings 61a. Similarly, a plurality of second limiting openings 82b may be configured so as to correspond to one second vapor deposition source opening 61b. Alternatively, one second limiting opening 82b may be configured so as to correspond to a plurality of second vapor deposition source openings 61b. In the present invention, "a limiting opening corresponding to a vapor deposition source opening" refers to a limiting opening that is designed so that the vapor deposition particles discharged from the vapor deposition source opening are capable of passing therethrough.

Although the number of the first and second vapor deposition source openings 61a and 61b and the first and second limiting openings 82a and 82b disposed in the X axis direction is four in FIGS. 5 and 8, the present invention is not limited to this and the number may be larger or smaller than this.

The limiting unit 80 may include a cooling device for cooling the limiting unit 80 in order to prevent a vapor deposition material that has adhered thereto from re-vaporizing or the like. Although there is no particular limitation on a cooling device, for example, a pipe for allowing a coolant (for example, water) to pass through, a cooling element such as a Peltier element or the like can be arbitrarily selected.

A vapor deposition material adheres to the limiting unit 80. Therefore, it is preferable that the limiting unit 80 to which the vapor deposition material has adhered is replaced with a new one every predetermined period. The limiting unit 80 may be configured to be dividable into a plurality of portions in order to make the operation for replacing the limiting unit 80 easy.

Figure 9:
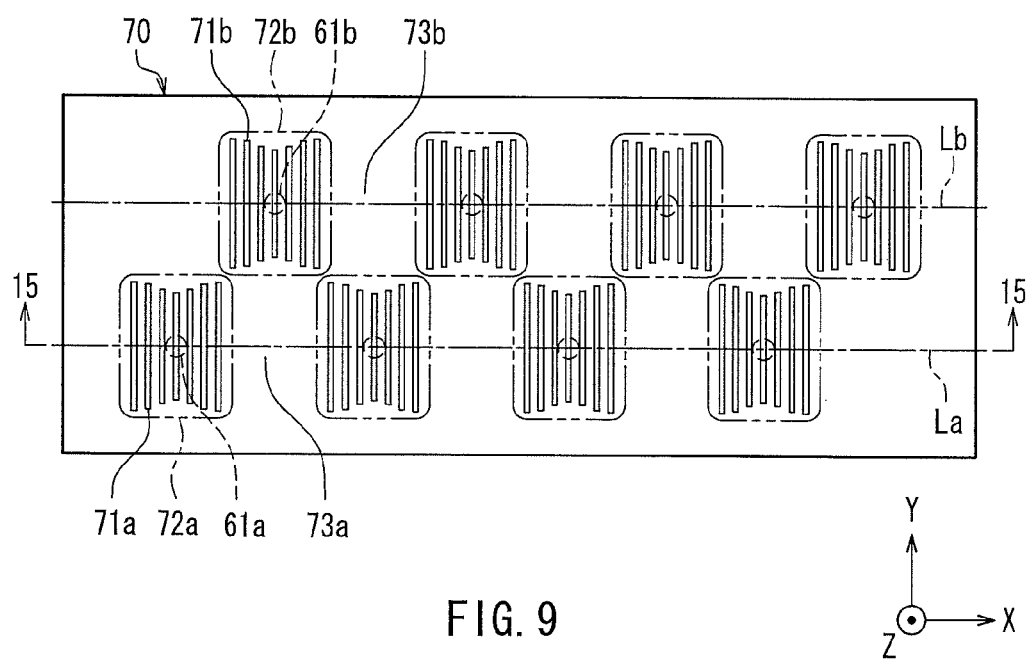
FIG. 9 is a plan view of a vapor deposition mask to be used in the vapor deposition device shown in FIG. 5.

The vapor deposition mask 70 is disposed on the opposite side of the limiting unit 80 from the vapor deposition source 60. FIG. 9 is a plan view of the vapor deposition mask 70. First vapor deposition source openings 61a and second vapor deposition source openings 61b of the vapor deposition source 60 disposed below the vapor deposition mask 70 are also shown in FIG. 9. The vapor deposition mask 70 is a plate-shaped piece that has a major surface (the surface having the largest area) parallel to the XY plane and in which a plurality of first mask openings 71a and a plurality of second mask openings 71b are formed at different positions in the X axis direction. The first and second mask openings 71a and 71b are through holes that penetrate the vapor deposition mask 70 in the Z axis direction. In the present embodiment, each of the mask openings 71a and 71b has an opening shape having a slot shape that is parallel to the Y axis, but the present invention is not limited thereto. All of the mask openings 71a and 71b may have the same shape and dimensions, or may have different shapes and dimensions.

It is preferable that the vapor deposition mask 70 is held by a mask tension mechanism (not shown). The mask tension mechanism prevents the occurrence of bending or extension of the vapor deposition mask 70 due to its own weight, by applying tension to the vapor deposition mask 70 in a direction parallel to the major surface thereof.

The plurality of vapor deposition source openings 61a and 61b are spaced apart from the limiting unit 80 in the Z axis direction, and the limiting unit 80 is spaced apart from the vapor deposition mask 70 in Z axis direction. It is preferable that the relative positions between the vapor deposition sources 60a and 60b, the limiting unit 80, and the vapor deposition mask 70 are substantially constant at least during vapor deposition by color.

As shown in FIGS. 6 and 7, the substrate 10 is held by a holding device 55. As the holding device 55, for example, an electrostatic chuck that holds the surface of the substrate 10 opposite to the deposition surface 10e thereof with electrostatic force can be used. The substrate 10 can thereby be held substantially without the substrate 10 being bent by its own weight. However, the holding device 55 for holding the substrate 10 is not limited to an electrostatic chuck and may be any other device.

The substrate 10 held by the holding device 55 is scanned (moved) in the movement direction 10a (see FIG. 5) parallel to the Y axis at a constant speed by a moving mechanism 56, on the opposite side from the vapor deposition source 60 with respect to the vapor deposition mask 70, with the substrate 10 being spaced apart from the vapor deposition mask 70 at a fixed spacing. The movement of the substrate 10 may be a reciprocal movement or a single direction movement in which the substrate 10 is moved in either direction. There is no particular limitation on the configuration of the moving mechanism 56. For example, any known transfer driving mechanism can be used such as a linear motor or a feed screw mechanism that rotates a feed screw by a motor.

The vapor deposition unit 50, the substrate 10, the holding device 55 for holding the substrate 10 and the moving mechanism 56 for moving the substrate 10 are housed in a vacuum chamber (not shown). The vacuum chamber is a hermetically sealed container, with the pressure in its internal space being reduced and maintained in a predetermined low pressure state.

The first vapor deposition particles 91a discharged from the first vapor deposition source openings 61a pass through the first limiting openings 82a of the limiting unit 80 and the first mask openings 71a of the vapor deposition mask 70 in this order, and adhere to the deposition surface (specifically, the surface of the substrate 10 facing the vapor deposition mask 70) 10e of the substrate 10 (see FIG. 6). Similarly, the second vapor deposition particles 91b discharged from the second vapor deposition source openings 61b pass through the second limiting openings 82b of the limiting unit 80 and the second mask openings 71b of the vapor deposition mask 70 in this order, and adhere to the deposition surface 10e of the substrate 10 (see FIG. 7). In FIGS. 6 and 7, the edges of the flows (vapor deposition flows) of the first and second vapor deposition particles 91a and 91b that respectively have been discharged from the first and second vapor deposition source openings 61a and 61b and that have passed through the first and second limiting openings 82a and 82b are shown by dashed lines.

Figure 10:
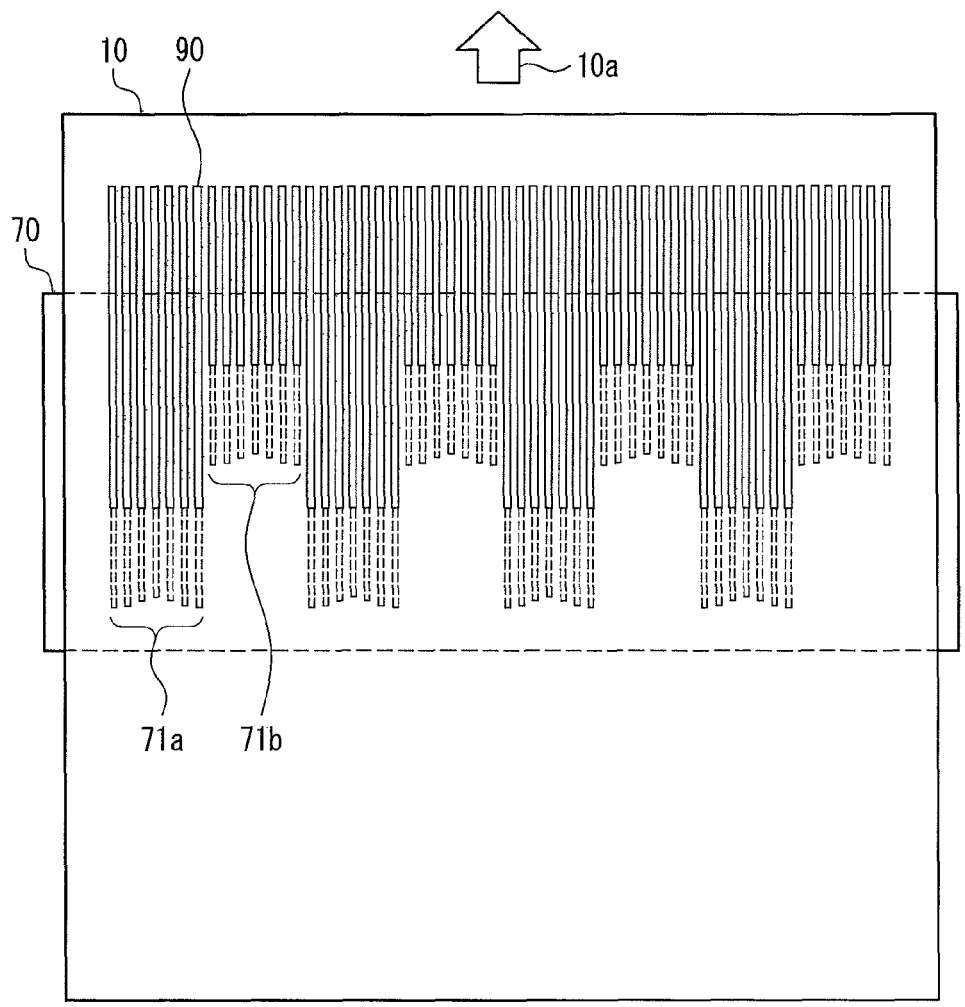
FIG. 10 is a see-through plan view showing how a stripe-shaped coating film is formed on a substrate using the vapor deposition device shown in FIG. 5.

If the substrate 10 is moved in the direction of the arrow of the Y axis in FIG. 5, as shown in FIG. 10, firstly the first vapor deposition particles 91a that have passed through the first mask openings 71a adhere to the substrate 10, and next the second vapor deposition particles 91b that have passed through the second mask openings 71b adhere to the substrate 10. As a result, a stripe-shaped coating film 90 extending in the Y axis direction is formed on the substrate 10. Note that in order to easily understand the pattern of the coating film 90 formed on the deposition surface 10e of the substrate 10, the coating film 90 is shown in FIG. 10 as though it is seen through the substrate 10. Note that in order to understand the pattern easily, only the coating film 90 formed by the first vapor deposition particles 91a that have passed through the first mask openings 71a is shown in FIG. 6, and only the coating film 90 formed by the second vapor deposition particles 91b that have passed through the second mask openings 71b is shown in FIG. 7.

As shown in FIG. 6, a region of the vapor deposition mask 70 where the flow of the first vapor deposition particles 91a (first vapor deposition flow) that have passed through the first limiting opening 82a reaches is referred to as a "first vapor deposition region 72a". A plurality of first vapor deposition regions 72a are arranged along the X axis direction at a fixed pitch. First vapor deposition regions 72a neighboring in the X axis direction do not overlap, so as to be independent of each other, and a first non-vapor deposition region 73a where the first vapor deposition particles 91a do not reach is formed therebetween. The first non-vapor deposition region 73a corresponds to the shadow region formed by the first limiting portion 81a when viewed from the first vapor deposition source opening 61a.

Similarly, as shown in FIG. 7, a region of the vapor deposition mask 70 where the second vapor deposition particles 91b that have passed through the second limiting opening 82b reach is referred to as a "second vapor deposition region 72b". A plurality of second vapor deposition regions 72b are arranged along the X axis direction at a fixed pitch. Second vapor deposition regions 72b neighboring in the X axis direction do not overlap, so as to be independent of each other, and a second non-vapor deposition region 73b where the flow of the second vapor deposition particles 91b (second vapor deposition flow) does not reach is formed therebetween. The second non-vapor deposition region 73b corresponds to the shadow region formed by the second limiting portion 81b when viewed from the second vapor deposition source opening 61b.

As shown in FIG. 9, the first and second vapor deposition regions 72a and 72b have a substantially rectangular shape that corresponds to the opening shape of the first and second limiting openings 82a and 82b. The first and second vapor deposition regions 72a and 72b are arranged in a staggered arrangement along two straight lines La and Lb parallel to the X axis whose positions in the Y axis direction are different from each other. The first mask openings 71a are formed only in the first vapor deposition regions 72a, and the second mask openings 71b are formed only in the second vapor deposition regions 72b. The first and second non-vapor deposition regions 73a and 73b extend along a direction parallel to the Y axis.

The first vapor deposition particles 91a that are to form the coating film 90 have to pass through the first limiting opening 82a and the first mask opening 71a. Also, the second vapor deposition particles 91b that are to form the coating film 90 have to pass through the second limiting openings 82b and the second mask openings 71b. The first vapor deposition particles 91a do not pass through the second limiting openings 82b to reach the deposition surface 10e of the substrate 10. Similarly, the second vapor deposition particles 91b do not pass through the first limiting openings 82a to reach the deposition surface 10e of the substrate 10. The limiting unit 80 and the vapor deposition mask 70 are designed so as to prevent a situation in which the vapor deposition particles 91a and 91b discharged from the vapor deposition source openings 61a and 61b reach the deposition surface 10e of the substrate 10 without passing through the limiting openings 82a and 82b and the mask openings 71a and 71b, and if necessary, a shielding plate (not shown) or the like that prevents flight of the vapor deposition particles 91a and 91b may be installed.

By performing vapor deposition three times by changing materials of the first vapor deposition particles 91a and/or the second vapor deposition particles 91b for each color, namely, red, green and blue (vapor deposition by color), stripe-shaped coating films 90 (specifically, light emitting layers 23R, 23G and 23B) that correspond to the respective colors of red, green and blue can be formed on the deposition surface 10e of the substrate 10.

According to Embodiment 1, the substrate 10 moves along the movement direction 10a relative to the vapor deposition unit 50 including the vapor deposition mask 70, and thus a dimension Lm of the vapor deposition mask 70 in the movement direction 10a of the substrate 10 can be set irrespective of a dimension of the substrate 10 in the same direction. This enables the use of a vapor deposition mask 70 that is smaller than the substrate 10. Accordingly, even if the substrate 10 is made large, the vapor deposition mask 70 does not need to be made large, and therefore there is little possibility of the occurrence of a problem in that the vapor deposition mask 70 is bent or extended by its own weight. Also, the vapor deposition mask 70 and a frame or the like for holding the vapor deposition mask 70 do not need to be made big and heavy. Accordingly, vapor deposition by color can be easily performed on large-sized substrates.

In Embodiment 1, the positions and the dimensions (opening widths) of the mask openings 71a and 71b in the X axis direction can be determined based on geometric calculations, taking into consideration the pattern of the coating film 90 to be formed, relative positional relationships between the vapor deposition source openings 61a and 61b, the mask openings 71a and 71b and the substrate 10, the thickness of the vapor deposition mask 70, and the like.

Also, the dimensions (opening lengths) of the mask openings 71a and 71b in the Y axis direction can be determined, taking into consideration the thickness of the coating film 90 to be formed, relative positional relationships between the mask openings 71a and 71b, the vapor deposition source openings 61a and 61b, and the like. The thickness of the coating film 90 can be calculated by deriving the total amount of vapor deposition particles (a value obtained by integrating the vapor deposition rate) that adhere to the region where the coating film is formed through numeral calculations.

Function of Limiting Unit

The effects of the limiting unit 80 on the first and second limiting portions 81a and 81b will now be described.

As shown in FIGS. 6 and 7, vapor deposition particles 91a and 91b are discharged from each of the vapor deposition source openings 61a and 61b with certain spreads (directionality). Specifically, the number of vapor deposition particles 91a and 91b discharged from the vapor deposition source openings 61a and 61b is the greatest in the direction directly upward (the Z axis direction) from the vapor deposition source openings 61a and 61b, and gradually decreases as the angle (departure angle) formed with respect to the upward direction increases. The vapor deposition particles 91a and 91b discharged from the vapor deposition source openings 61a and 61b travel straight in their respective discharged direction. Accordingly, each of mask openings 71a and 71b mostly receives, but not necessarily limited thereto, the vapor deposition particles discharged from vapor deposition source openings located directly below the mask openings in the case where the limiting unit 80 is not present and also receives vapor deposition particles discharged from vapor deposition source openings located obliquely downward.

Figure 11:
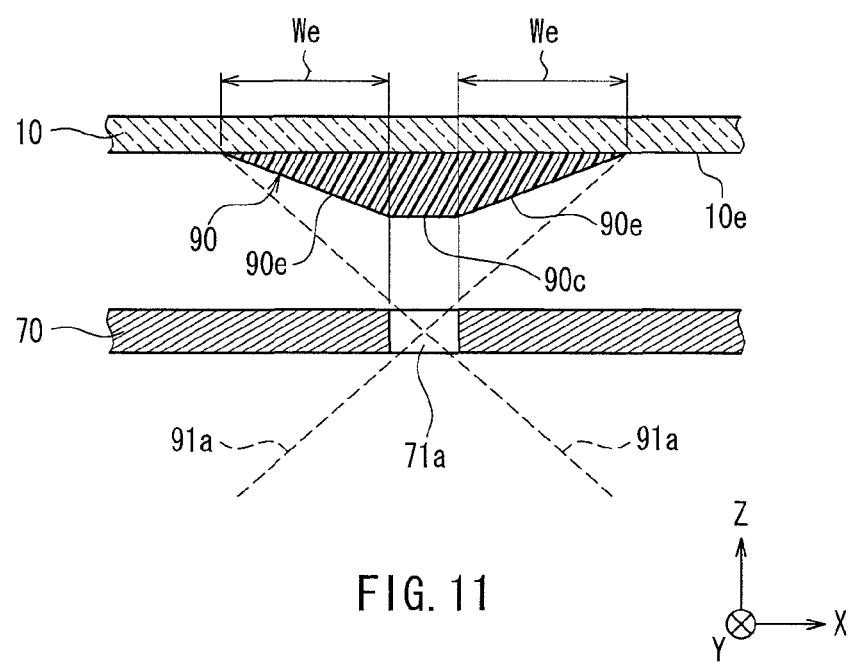
FIG. 11 is an enlarged cross-sectional view along a plane perpendicular to the traveling direction of the substrate, illustrating the cause of blurring occurring at the edge of a coating film.

FIG. 11 is an enlarged cross-sectional view along a plane passing across a given first mask opening 71a and parallel to the XZ plane similarly to FIG. 6. Dashed lines 91a indicate the trajectory of the first vapor deposition particles 91a passing through the first mask opening 71a at the maximum incidence angle in the case where the limiting unit 80 is not present. As described above, the vapor deposition particles 91a coming from various directions pass through the mask opening 71a. The number of vapor deposition particles 91 that reach a deposition surface 10e of the substrate 10 is the greatest in a region directly above the mask opening 71a and gradually decreases as the position gets farther away therefrom. Accordingly, as shown in FIG. 11, on the deposition surface 10e of the substrate 10, a coating film main portion 90c having a large and substantially constant thickness is formed in the region where the mask opening 71a is projected onto the substrate 10 from directly above, and blurred portions 90e that are gradually thinner as the position gets farther away from the coating film main portion 90c are formed on both sides of the coating film main portion 90c. Then, the blurred portions 90e cause blurring at the edge of the coating film 90.

Although not shown, the above description similarly holds true for the coating film formed by the second vapor deposition particles 91b passing through the second mask openings 71b.

In order to reduce the width We of the blurred portion 90e, a space between the vapor deposition mask 70 and the substrate 10 needs only be reduced. However, because it is necessary to move the substrate 10 relative to the vapor deposition mask 70, it is not possible to reduce the space between the vapor deposition mask 70 and the substrate 10 to zero.

If the blurred portion 90e extends to the neighboring light emitting layer region having a different color due to an increase in the width We of the blurred portion 90e, it causes "color mixing" or degradation of the characteristics of the organic EL element. In order to prevent the blurred portion 90e from extending to the neighboring light emitting layer region having a different color, so as to not cause color mixing, it is necessary to reduce the opening width of pixels (the pixels referring to the sub-pixels 2R, 2G and 2B shown in FIG. 2) or to increase the pixel pitch so as to increase the non-light-emitting region. However, if the opening width of the pixels is reduced, the light-emitting region will be small, causing a reduction in brightness. If the current density is increased in order to obtain the required brightness, the organic EL element will have a short service life and easily be damaged, causing a reduction in reliability. If, on the other hand, the pixel pitch is increased, display of high definition images cannot be achieved, reducing the quality of display.

In contrast, in the present embodiment, as shown in FIGS. 6 and 7, the limiting unit 80 is provided between the vapor deposition source 60 and the vapor deposition mask 70. Among vapor deposition particles 91a and 91b discharged from each of the vapor deposition source openings 61a and 61b with certain spreads (directionalities), those having a large velocity vector component in the X axis direction collide with and adhere to the limiting portions 81a and 81b, and therefore cannot pass through limiting openings 82a and 82b and cannot reach the mask openings 71a and 71b. In other words, the limiting portions 81a and 81b limit spread angles in the X axis direction of the vapor deposition flows of the vapor deposition particles 91a and 91b discharged from the vapor deposition source openings 61a and 61b. As a result, the incidence angles of the vapor deposition particles 91a and 91b entering the mask openings 71a and 71b are limited. Here, "incidence angles" with respect to the mask openings 71a and 71b are defined as the angles formed between the flight directions of the vapor deposition particles 91a and 91b entering the mask openings 71a and 71b and the Z axis, on a projection onto the XZ plane.

In this manner, the directionalities of the vapor deposition particles 91a and 91b in the X axis direction are improved by arranging a plurality of limiting portions 81a and 81b along the X axis direction. Therefore, the width We of the blurred portion 90e can be reduced. Therefore, vapor deposition by color for forming light emitting layers 23R, 23G and 23B using the vapor deposition device of the present embodiment can prevent color mixing from occurring. Accordingly, the pixel pitch can be reduced, and in this case, it is possible to provide an organic EL display device that is capable of displaying high definition images. Meanwhile, the light-emitting region may be enlarged without changing the pixel pitch, and in this case, it is possible to provide an organic EL display device that is capable of displaying highly bright images. Also, because it is not necessary to increase the current density in order to increase the brightness, the organic EL element does not have a short service life and is not easily damaged, and a reduction in reliability can be prevented.

Function Resulting from Vapor Deposition Region being Arranged in Staggered Arrangement Next, effects resulting from the first and second vapor deposition regions 72a and 72b being arranged in a staggered arrangement as shown in FIG. 9 will now be described, with comparison with a comparative example.

Figure 12:
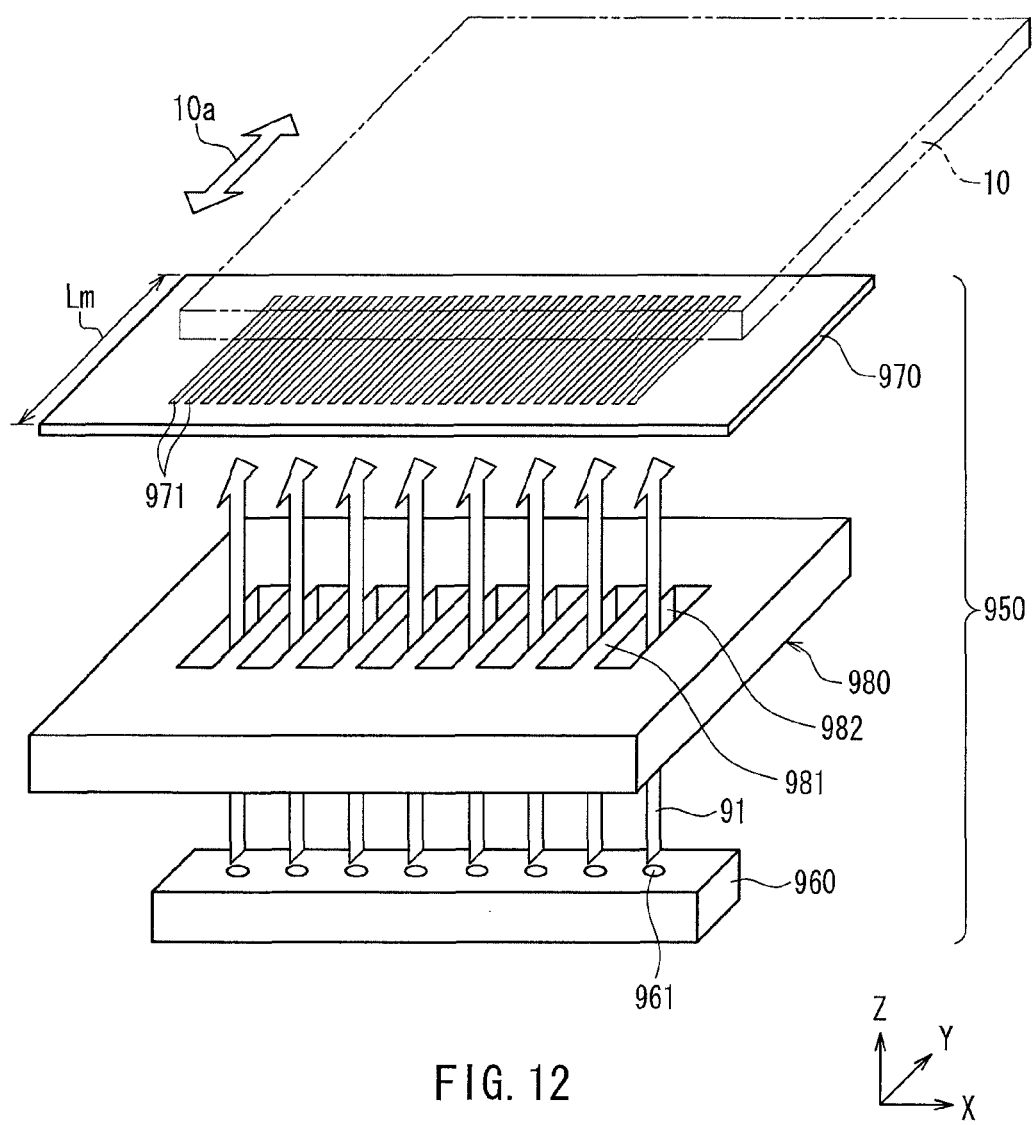
FIG. 12 is a perspective view showing the basic configuration of a vapor deposition device according to a comparative example.

FIG. 12 is a perspective view showing the basic configuration of a vapor deposition device according to a comparative example. Similarly to the vapor deposition device according to Embodiment 1 shown in FIG. 5, this vapor deposition device is provided with a vapor deposition unit 950 that includes a vapor deposition source 960, a limiting unit 980 and a vapor deposition mask 970 in this order. The vapor deposition mask 970, partly seen through the substrate 10 that is indicated by dash-double-dotted lines, is shown in FIG. 12 so that the arrangement of the mask openings 971 formed on the vapor deposition mask 970 can be understood.

The vapor deposition source 960 includes a plurality of vapor deposition source openings 961 arranged along the X axis direction at a fixed pitch. The pitch of vapor deposition source openings 961 in the X axis direction is half of the pitch of first vapor deposition source openings 61a of Embodiment 1 shown in FIG. 5 in the X axis direction (or the pitch of second vapor deposition source openings 61b in the X axis direction).

A plurality of limiting openings 982 are formed in the limiting unit 980 along a straight line parallel to the X axis at the same pitch as that of the plurality of vapor deposition source openings 961. The plurality of limiting openings 982 correspond one-to-one to the plurality of vapor deposition source openings 961, and are each disposed above the corresponding vapor deposition source opening 961. The limiting openings 982 neighboring in the X axis direction are separated by a limiting portion 981.

A plurality of mask openings 971 are arranged in the vapor deposition mask 970 along the X axis direction. The mask openings 971 are formed so that coating films 90 are formed at the same positions in the X axis direction as the positions at which the coating films 90 (see FIG. 10) are formed by the vapor deposition device of the present embodiment shown in FIG. 5

Figure 13:
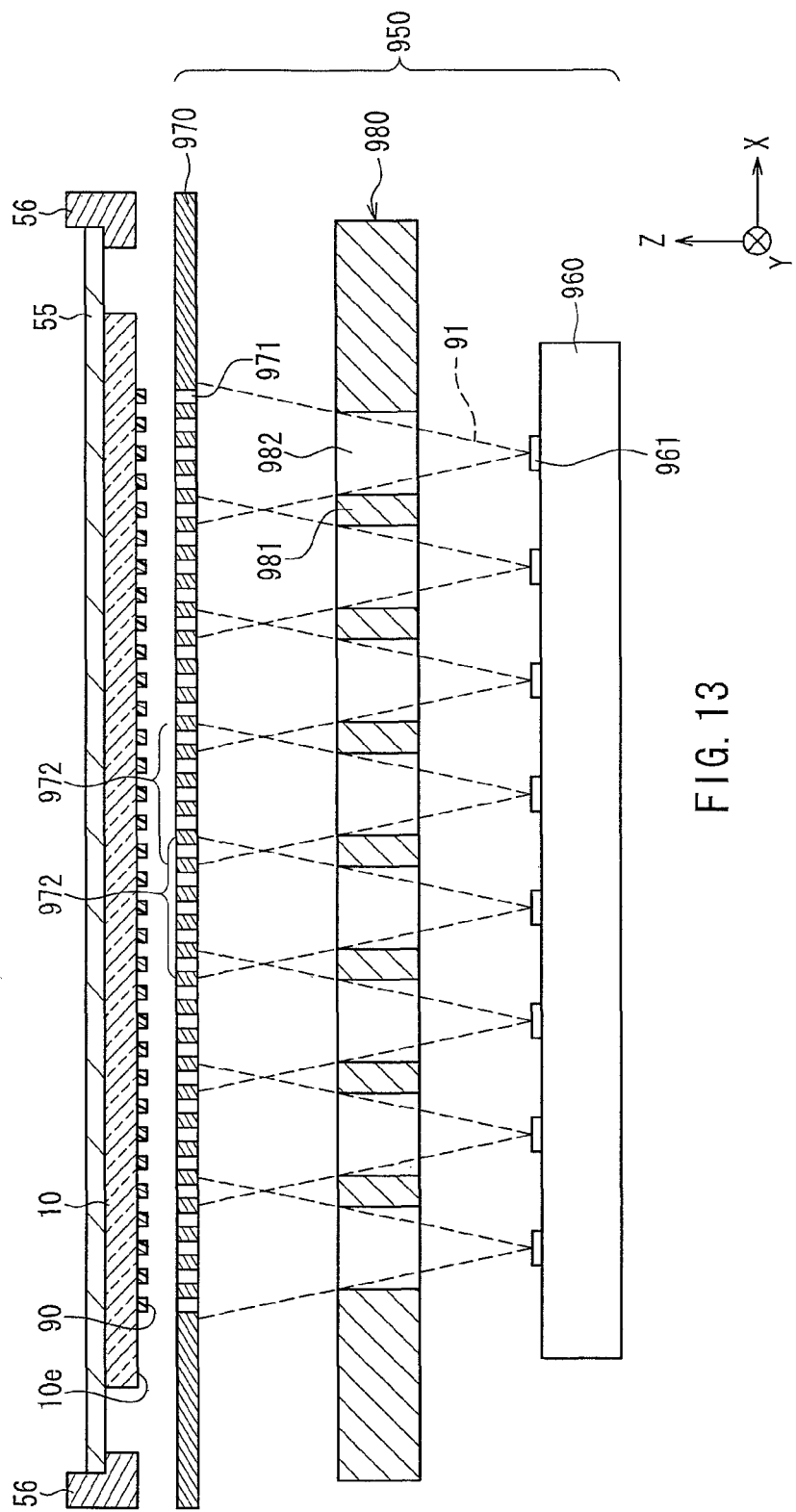
FIG. 13 is a front cross-sectional view of the vapor deposition device according to the comparative example shown in FIG. 12, along a plane perpendicular to the traveling direction of the substrate and passing across the vapor deposition source.

FIG. 13 is a cross-sectional view of the vapor deposition device of FIG. 12, along a plane parallel to the XZ plane passing across the vapor deposition source 960. Similarly to FIGS. 6 and 7, a region of the vapor deposition mask 970 where the flow of vapor deposition particles 91 (vapor deposition flow) that have passed through limiting opening 982 reaches is referred to as a "vapor deposition region 972". Unlike FIGS. 6 and 7, portions of the vapor deposition regions 972 neighboring in the X axis direction overlap each other to give a continuous region. Therefore, a non-vapor deposition region (see the first non-vapor deposition region 73a of FIG. 6 and the second non-vapor deposition region 73b of FIG. 7) corresponding to the shadow region formed by the limiting portion 981 when viewed from the vapor deposition source opening 961 is not formed on the vapor deposition mask 970.

Similarly to the vapor deposition device of Embodiment 1 shown in FIG. 5, the limiting portion 981 of the limiting unit 980 of the vapor deposition device according to the comparative example shown in FIGS. 12 and 13 limits the incidence angles of the vapor deposition particles 91 entering the mask opening 971. Therefore, the width We of the blurred portion 90e shown in FIG. 11 can be reduced.

However, with the vapor deposition device according to the above-described comparative example, if the limiting unit 980 is positionally offset in the X axis direction with respect to the vapor deposition source openings 961, there is a problem in that a coating film cannot be formed at a desired position on the substrate 10.

This will now be described below.

Figure 14A:
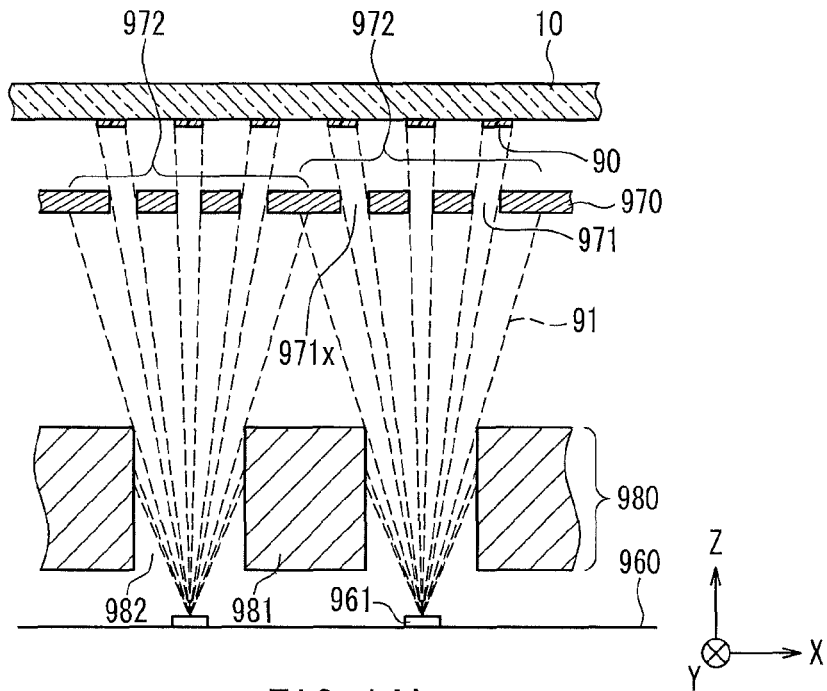
FIG. 14A is an enlarged cross-sectional view showing the coating films formed on the substrate in a state in which a limiting unit is not positionally offset in the vapor deposition device according to the comparative example shown in FIG. 12.

FIG. 14A is a cross-sectional view showing the coating film 90 formed on the substrate 10 in a state in which the limiting unit 980 is not positionally offset with respect to the vapor deposition source openings 961. The vapor deposition source opening 961 is disposed at a central position of a pair of limiting portions 981 neighboring in the X axis direction. Among the vapor deposition particles 91 discharged from the vapor deposition source openings 961, those that have passed through the limiting opening 982 directly above the vapor deposition source opening 961 and have further passed through the mask opening 971 adhere to the substrate 10 to form the coating film 90.

Figure 14B:
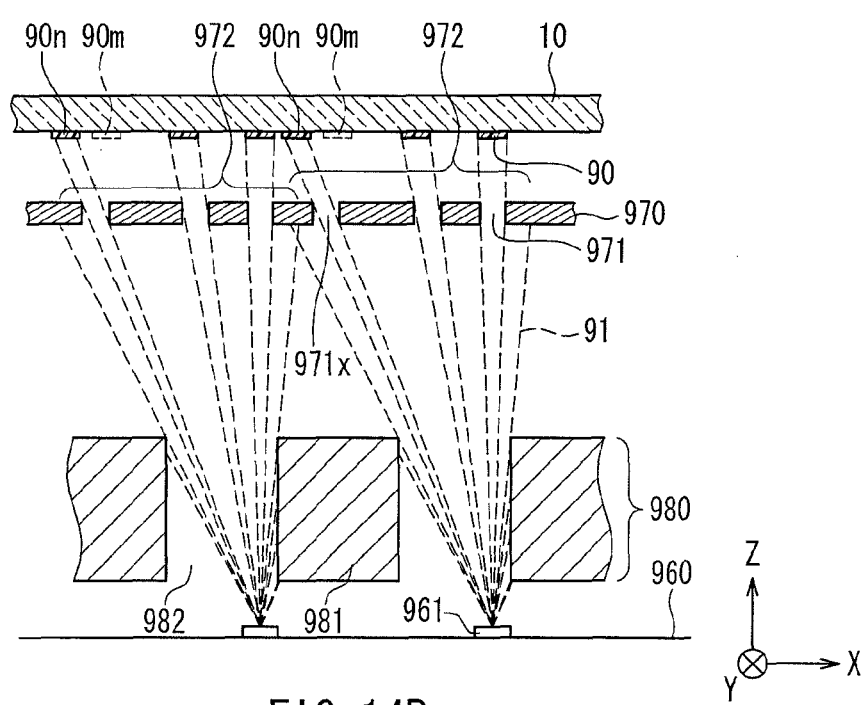
FIG. 14B is an enlarged cross-sectional view showing the coating films formed on the substrate in a state in which the limiting unit is positionally offset with respect to the vapor deposition source openings in the vapor deposition device according to the comparative example shown in FIG. 12.

FIG. 14B is a cross-sectional view showing the coating film 90 formed on the substrate 10 in a state in which the limiting unit 980 is positionally offset, from the state of FIG. 14A, toward the left of the diagram of FIG. 14B with respect to the vapor deposition source openings 961 and the vapor deposition mask 970 along the X axis direction. The limiting unit 980 is positionally offset, and limiting opening 982 is thereby also positionally offset, and thus the vapor deposition region 972 is also positionally offset with respect to the vapor deposition mask 970.

As can be understood by comparing FIG. 14A with FIG. 14B, the vapor deposition source opening that has discharged the vapor deposition particles 91 entering a mask opening 971x has changed due to the limiting unit 980 being positionally offset. Accordingly, the coating film 90m formed in FIG. 14A is not formed in FIG. 14B, and instead, a coating film 90n is formed at an undesired position. In other words, the coating film 90m is positionally offset to the position of the coating film 90n.

A problem in that the coating film 90 is not formed at a desired position, which is shown in FIG. 14B, is caused by portions of vapor deposition regions 972 neighboring in the X axis direction overlapping each other, and a mask opening (a mask opening 971x in the above-described example) being formed in the vicinity of the overlapped portions.

A positional offset of the limiting unit 980 in the X axis direction with respect to the vapor deposition source openings 961 and vapor deposition mask 970, which is shown in FIG. 14B, may occur, for example, in the case where the limiting unit 980 is replaced. As described above, the vapor deposition particles 91 having a large velocity vector component in the X axis direction are captured by the limiting portions 981, and therefore the vapor deposition material accumulates on the surface of the limiting portions 981 over time. If the thickness of the vapor deposition material that has accumulated increases, the characteristics of the limiting portions 981 capturing the vapor deposition particles 91 are impaired, and the functions of the limiting portions 981 limiting the incidence angles of the vapor deposition particles 91 are impaired due to a reduction in the dimensions of the limiting openings 982 in the X axis direction. Also, if the vapor deposition material that has accumulated on the limiting portions 981 comes off and falls, it contaminates the inside of the vacuum chamber. Therefore, it is necessary for the limiting unit 980 to which the vapor deposition material has adhered to be regularly replaced with a clean limiting unit 980 to which the vapor deposition material has not adhered. When a clean limiting unit 980 is attached, a positional offset of the limiting unit 980 in the X axis direction with respect to the vapor deposition source openings 961 and the vapor deposition mask 970, which is shown in FIG. 14B, may occur.

Also, a positional offset of the limiting unit 980 in the X axis direction shown in FIG. 14B may also be caused by the respective thermal expansions of the vapor deposition source 960 and the limiting unit 980. In order to discharge the vaporized vapor deposition material from the vapor deposition source openings 961 as the vapor deposition particles 91, it is necessary to maintain the vapor deposition source 960 at a high temperature, and therefore the thermal expansion thereof cannot be avoided. Also, the limiting unit 980 also is heated by radiant heat from the vapor deposition source 960 and thermally expands. Furthermore, because the vapor deposition source 960 and the limiting unit 980 are made of different materials, they have different linear expansion coefficients. As a result, a positional offset of the limiting portions 981 with respect to the vapor deposition source openings 961 may occur.

If the size of the vapor deposition device increases, an error in attachment of the limiting unit 980 is likely to occur, and moreover, a difference in thermal expansions between the vapor deposition source 960 and the limiting unit 980 increases, and therefore a positional offset of the limiting unit 980 in the X axis direction shown in FIG. 14B generally increases.

Note that a positional offset of the limiting unit 980 may occur in not only the X axis direction but also the Y axis direction when the limiting unit 980 is replaced. However, the coating film 90 has a striped-shape extending in the Y axis direction, and therefore the position of the coating film 90 does not substantially change even if the limiting unit 980 is positionally offset in the Y axis direction.

Next, the reason why positional offset of the coating film 90 described in FIG. 14B does not occur in Embodiment 1 will now be described.

Figure 15A:
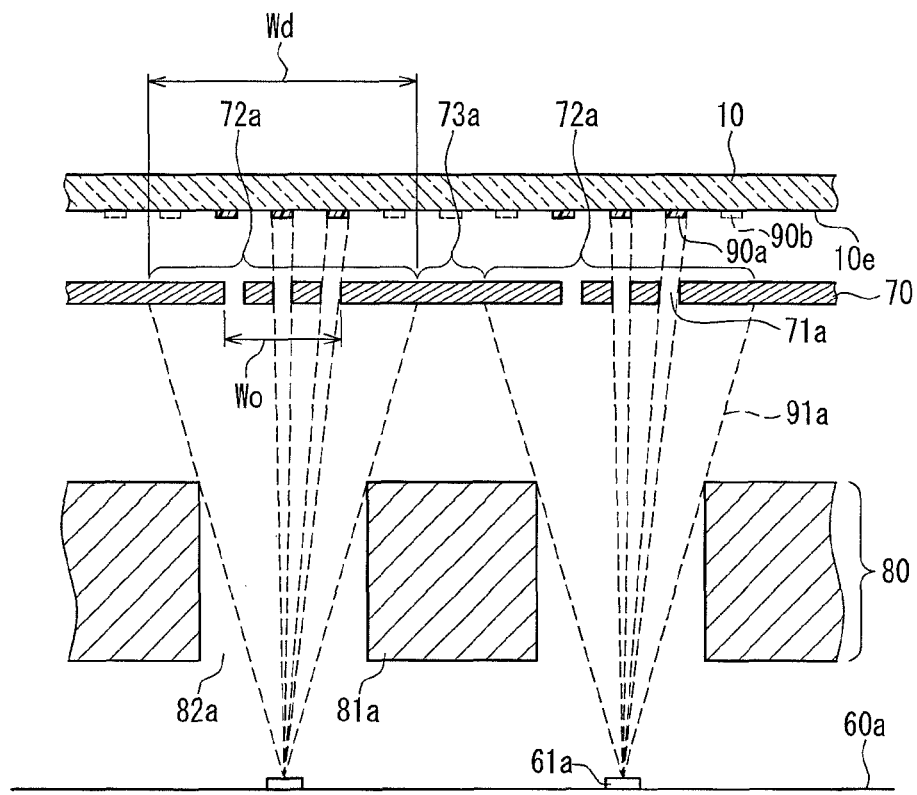
FIG. 15A is an enlarged cross-sectional view along a plane passing across the first vapor deposition source and including the line 15-15 of FIG. 9, showing the coating films formed on the substrate in a state in which the limiting unit is not positionally offset in the vapor deposition device shown in FIG. 5.

FIG. 15A is an enlarged vertical cross-sectional view along a plane passing across the first vapor deposition source 60a and including the line 15-15 of FIG. 9, showing the coating film formed on the substrate 10 in an ideal state in which the limiting unit 80 is not positionally offset in the vapor deposition device according to Embodiment 1.

The first vapor deposition regions 72a that are regions on the vapor deposition mask 70 where the flow of the first vapor deposition particles 91a (first vapor deposition flow) that have passed through the first limiting openings 82a reaches are disposed with a non-vapor deposition region 73a being sandwiched therebetween so as to be set apart from each other in the X axis direction. A plurality of first mask openings 71a are formed in each of the first vapor deposition regions 72a. The first vapor deposition particles 91a that have passed through first mask openings 71a adhere to the deposition surface 10e of the substrate 10 so as to form first coating films 90a.

In the present example, as described in FIG. 10, the substrate 10 moves in the direction of the arrow of the Y axis in FIG. 5. Although not shown, the second vapor deposition particles 91b that have passed through the second mask openings 71b adhere to the deposition surface 10e of the substrate 10 on the downstream side of the cross-section of FIG. 15A in the movement direction of the substrate 10 so as to form the second coating films 90b. FIG. 15A also shows the second coating films 90b with dashed lines.

Figure 15B:
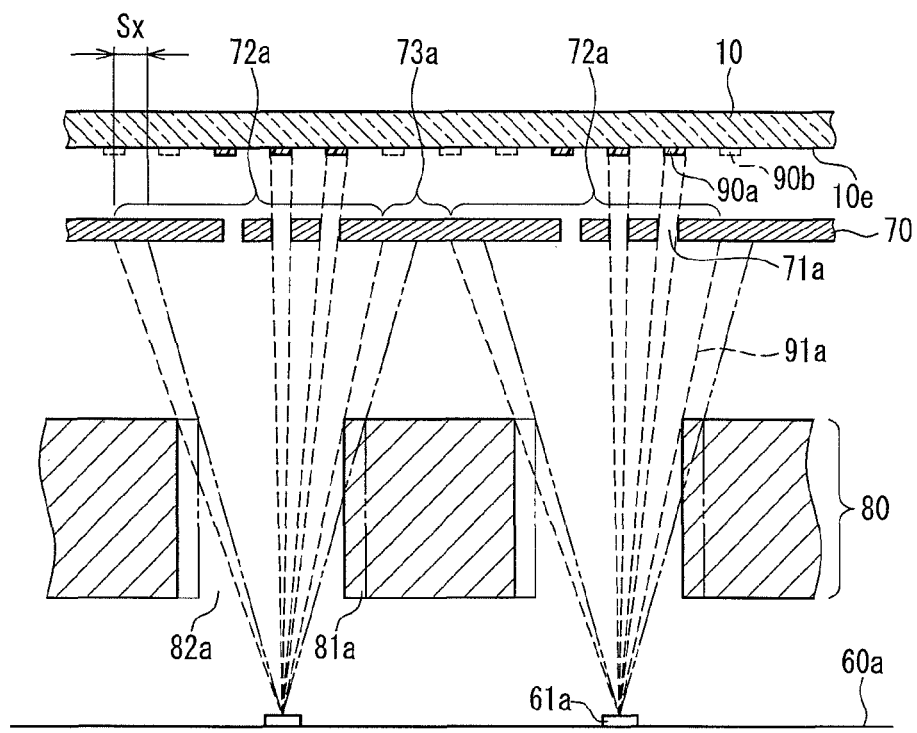
FIG. 15B is an enlarged cross-sectional view along a plane passing across the first vapor deposition source, showing the coating films formed on the substrate in a state in which the limiting unit is positionally offset with respect to the vapor deposition source openings in the vapor deposition device shown in FIG. 5.

FIG. 15B is an enlarged cross-sectional view along a plane passing across the first vapor deposition source 60a, showing the coating films formed on the substrate 10 in a state in which the limiting unit 80 is positionally offset, from the state of FIG. 15A, toward the left of the diagram of FIG. 15B with respect to the first vapor deposition source openings 61a and the vapor deposition mask 70 in the X axis direction. For reference, the first limiting portions 81a and the flows of the first vapor deposition particles 91a before positional offset (that is, the state of FIG. 15A) are indicated by dash-double-dotted lines. The first limiting openings 82a also are positionally offset due to the limiting unit 80 being positionally offset, and therefore the first vapor deposition regions 72a also are positionally offset with respect to the vapor deposition mask 70 in the X axis direction by an amount of offset Sx.

However, as can be understood if FIG. 15A is compared with FIG. 15B, the first mask openings 71a included in each of the first vapor deposition regions 72a do not change before and after positional offset. Therefore, the position of the first vapor deposition source opening 61a that has discharged the first vapor deposition particles 91a entering each of the first mask openings 71a, that is, the incidence angles of the first vapor deposition particles 91a entering each of the first mask openings 71a do not change before and after positional offset.

Although the coating films 90a formed by the first vapor deposition particles 91a that have passed through the first mask openings 71a are described in FIGS. 15A and 15B, this description holds true for the coating films 90b formed by the second vapor deposition particles 91b that have passed through the second mask openings 71b.

As described above, in the present embodiment, as shown in FIG. 9, vapor deposition regions (first vapor deposition regions 72a and second vapor deposition regions 72b) are disposed with non-vapor deposition regions (first non-vapor deposition regions 73a and second non-vapor deposition regions 73b) being sandwiched therebetween along straight lines (straight lines La, Lb) parallel to the X axis so as to be independent of each other in the X axis direction. Furthermore, the mask openings (first mask openings 71a and second mask openings 71b) are disposed only in vapor deposition regions (first vapor deposition regions 72a and second vapor deposition regions 72b).

Accordingly, with Embodiment 1, even if the limiting unit 80 is displaced in the X axis direction with respect to the vapor deposition sources 60a and 60b and the vapor deposition mask 70, the positions of the coating films 90 formed on the substrate 10 do not change.

With Embodiment 1, a large number of stripe-shaped coating films 90 are formed on the substrate 10 at a substantially fixed pitch in the X axis direction. If non-vapor deposition regions are present on the vapor deposition mask 70, it is not possible to form coating films in regions on the substrate corresponding to said non-vapor deposition regions. In view of this, with the present embodiment, as shown in FIG. 9, the first vapor deposition regions 72a and the second vapor deposition regions 72b are arranged in a staggered arrangement. Accordingly, it is possible to form the second mask openings 71b at different positions in the Y axis direction from the positions of the first non-vapor deposition regions 73a located on the straight line La. Also, it is possible to form the first mask openings 71a at different positions in the Y axis direction from the positions of the second non-vapor deposition regions 73b located on the straight line Lb. As a result, the present embodiment enables the formation of a large amount of stripe-shaped coating films 90 at a substantially fixed short pitch in the X axis direction over a wide range of the substrate 10 in the X axis direction.

The widths of non-vapor deposition regions 73a and 73b in the X axis direction can be arbitrarily set, taking into consideration the amount of positional offset of the limiting unit 80 in the X axis direction that is assumed, and the like.

The mask openings are formed in vapor deposition regions. If the mask opening protrudes beyond the vapor deposition region due to the limiting unit 80 being positionally offset in the X axis direction, the vapor deposition particles do not enter said mask opening, and therefore a coating film may not be formed at a desired position. Therefore, as shown in FIG. 15A, if the width of the vapor deposition region (the first vapor deposition region 72a) in the X axis direction and the width of the region where the mask opening is present (a mask opening region) in the X axis direction are respectively denoted by Wd and Wo, it is preferable that the ratio Wo/Wd<1, and it is more preferable that the ratio Wo/Wd is significantly smaller than 1. Note that, the width Wo is defined by the distance between the outer edges of the two mask openings located on both outer sides in the X axis direction among the plurality of mask openings that are present in the vapor deposition region. An upper limit for the ratio Wo/Wd can be arbitrarily set, taking into consideration the amount of positional offset of the limiting unit 80 in the X axis direction that is assumed, and the like.

Although the first vapor deposition source 60a and the second vapor deposition source 60b constituting the vapor deposition source 60 are set apart from each other in the above-described example, they may be integrated.

Although a plurality of first limiting openings 82a and a plurality of second limiting openings 82b are formed in a shared limiting unit 80 in the above-described example, the limiting unit 80 may be divided into a first limiting unit in which a plurality of first limiting openings 82a are formed and a second limiting unit in which a plurality of second limiting openings 82b are formed. Similarly, although a plurality of first mask openings 71a and a plurality of second mask openings 71b are formed in a shared vapor deposition mask 70 in the above-described example, the vapor deposition mask 70 may be divided into a first vapor deposition mask in which a plurality of first mask openings 71a are formed and a second vapor deposition mask in which a plurality of second mask openings 71b are formed.

The vapor deposition source, the limiting unit and the vapor deposition mask may be divided into blocks where vapor deposition source openings, limiting openings and mask openings corresponding to one vapor deposition region or a plurality of vapor deposition regions adjacent to one another are configured as one block. In this case, vapor deposition conditions may be arbitrarily set and controlled for each block.

Although a plurality of vapor deposition regions are arranged in a staggered arrangement along two straight lines parallel to the X axis in the above-described example, the present invention is not limited to this. As described above, vapor deposition regions need only to be arranged along the X axis direction with non-vapor deposition regions being sandwiched therebetween, and mask openings need only to be formed at different positions in the Y axis direction from the positions of non-vapor deposition regions.

Figure 16:
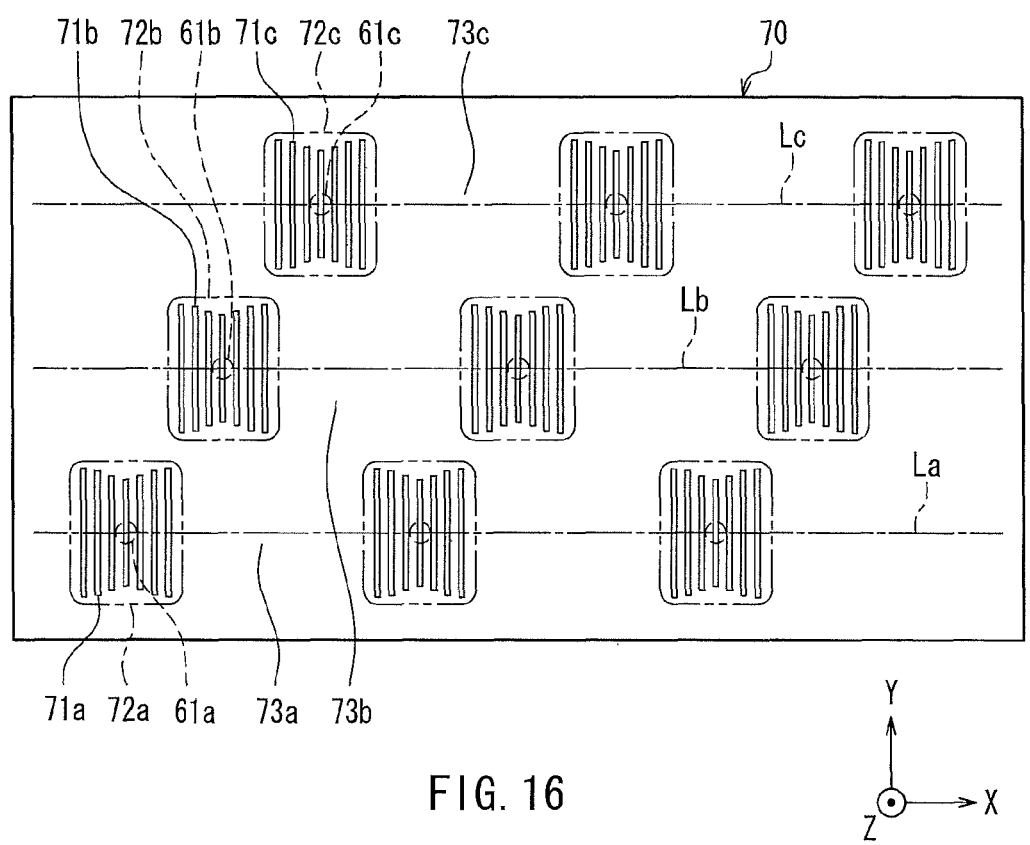
FIG. 16 is a plan view of another vapor deposition mask to be used in a vapor deposition device according to Embodiment 1 of the present invention.

For example, as shown in FIG. 16, vapor deposition regions 72a, 72b and 72c may be respectively arranged along three straight lines La, Lb and Lc parallel to the X axis at a fixed pitch. As a result, the vapor deposition regions 72a, 72b and 72c are arranged in a stepwise arrangement. A plurality of mask openings 71a, 71b and 71c are respectively formed in the vapor deposition regions 72a, 72b and 72c. Vapor deposition source openings 61a, 61b and 61c and limiting openings (not shown) are arranged such that the vapor deposition regions 72a, 72b and 72c are formed at such positions. Also in the configuration of FIG. 16, the vapor deposition regions 72a, 72b and 72c are arranged in the X axis direction with non-vapor deposition regions 73a, 73b and 73c being respectively sandwiched therebetween. Moreover, the mask openings 71b and 71c for the vapor deposition regions 72b and 72c are arranged at different positions in the Y axis direction from the positions of the non-vapor deposition regions 73a. The same applies to the non-vapor deposition regions 73b and the non-vapor deposition regions 73c.

A plurality of vapor deposition regions may be arranged along four straight lines or more that are parallel to the X axis so as to be independent of one another.

Figure 17:
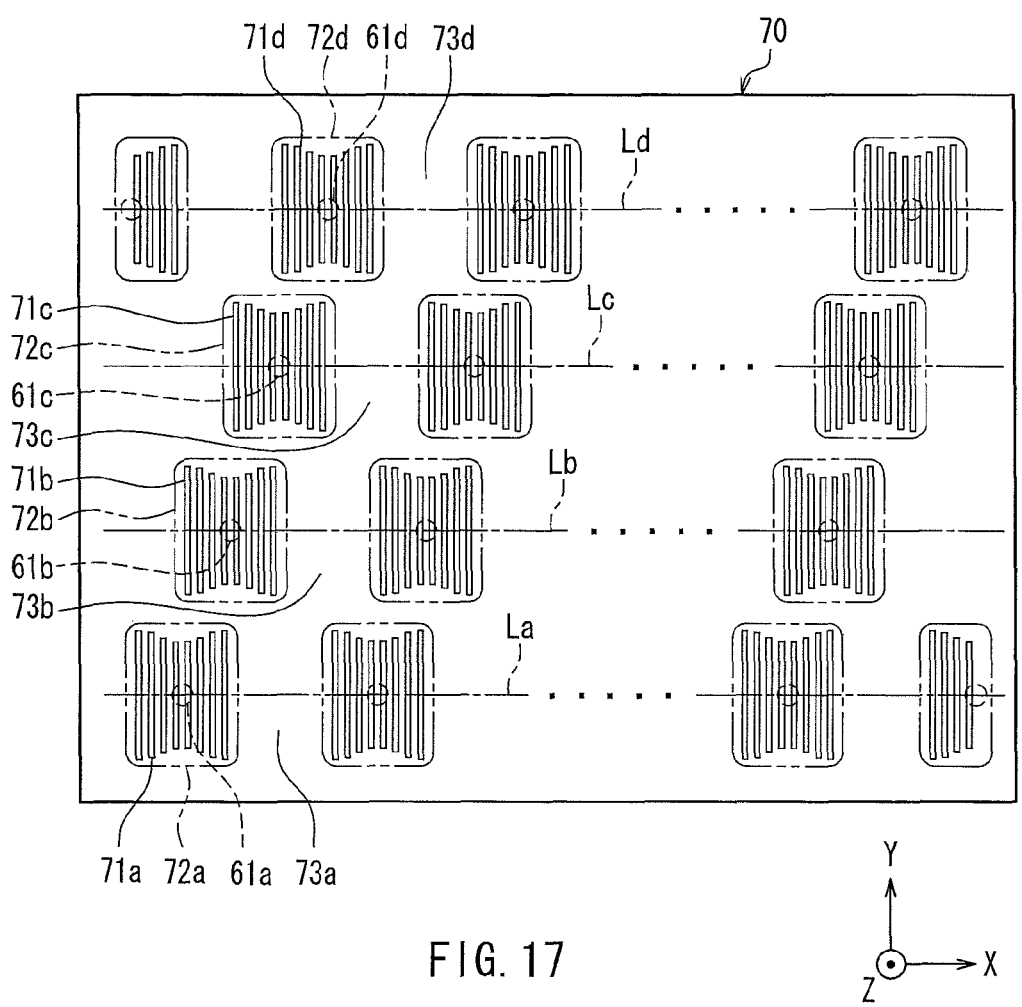
FIG. 17 is a plan view of still another vapor deposition mask to be used in the vapor deposition device according to Embodiment 1 of the present invention.

Although one stripe-shaped coating film is formed only by vapor deposition particles that have passed through one mask opening in the above-described example, the present invention is not limited to this. For example, a plurality of vapor deposition regions arranged at different positions in the Y axis direction are arranged such that at least a portion of the positions thereof in the X axis direction overlap one another, and it is thereby possible to form one stripe-shaped coating film with vapor deposition particles that have passed through a plurality of mask openings. One example is shown in FIG. 17. Vapor deposition regions 72a, 72b, 72c and 72d are respectively arranged at a fixed pitch along four straight lines La, Lb, Lc and Ld that are parallel to the X axis direction. As a result, the vapor deposition regions 72a, 72b, 72c and 72d are respectively arranged in a stepwise arrangement. A plurality of mask openings 71a, 71b, 71c and 71d are respectively formed in the vapor deposition regions 72a, 72b, 72c and 72d. Vapor deposition source openings 61a, 61b, 61c and 61d and limiting openings (not shown) are arranged such that the vapor deposition regions 72a, 72b, 72c and 72d are formed at such positions. In the present example, each stripe-shaped coating film is formed by the overlapping of the vapor deposition particles that have passed through the mask openings 71a and the vapor deposition particles that have passed through the mask openings 71b, the overlapping of the vapor deposition particles that have passed through the mask opening 71b and the vapor deposition particles that have passed through the mask openings 71c, the overlapping of the vapor deposition particles that have passed through the mask openings 71c and the vapor deposition particles that have passed through the mask openings 71d, or the overlapping of the vapor deposition particles that have passed through the mask openings 71d and the vapor deposition particles that have passed through the mask openings 71a.

Embodiment 2

Hereinafter, Embodiment 2 will now be described, focusing on differences from Embodiment 1. In diagrams referenced in the following description, the same reference numerals are given to components corresponding to the components described in Embodiment 1, and redundant description thereof will be omitted.

Figure 18:
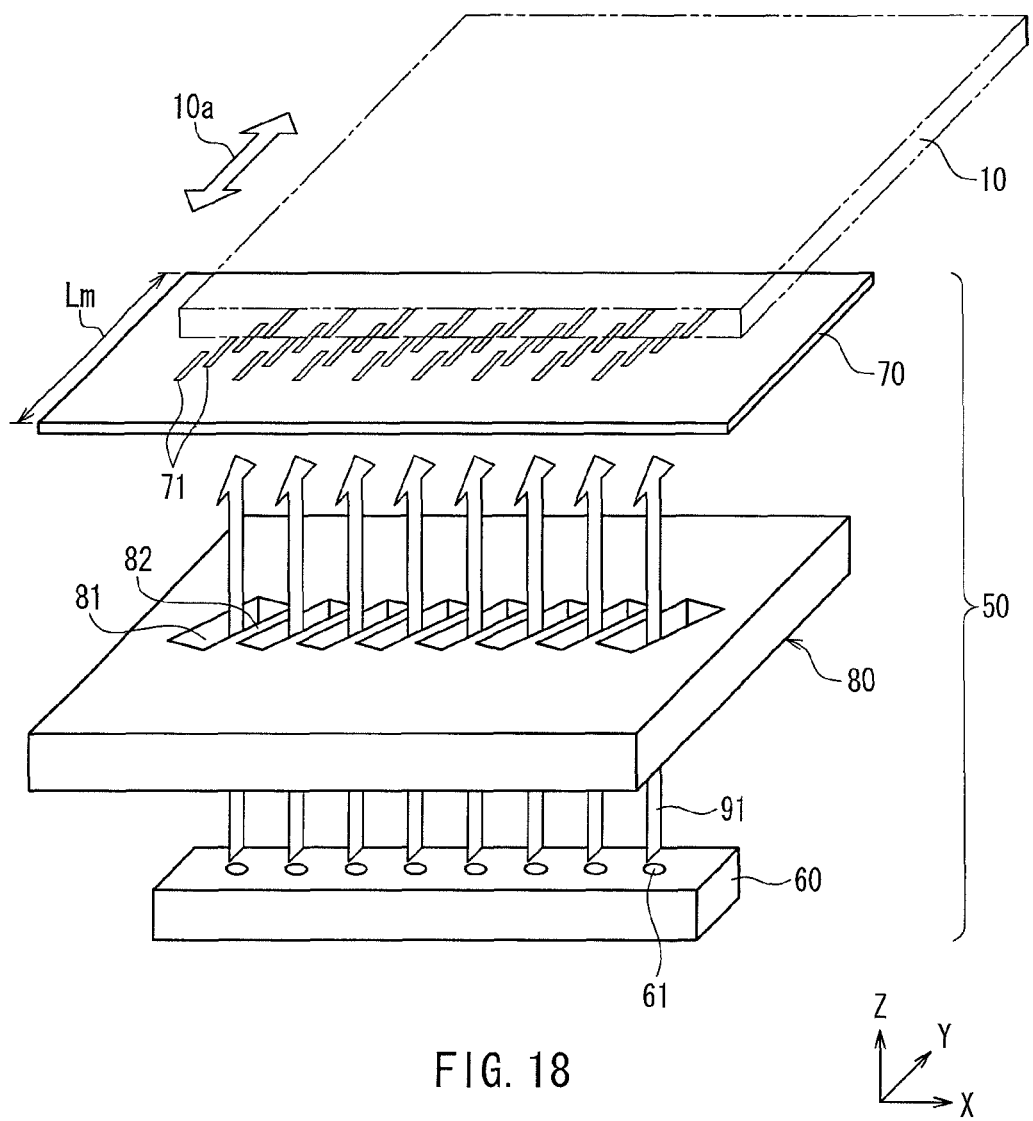
FIG. 18 is a perspective view showing the basic configuration of a vapor deposition device according to Embodiment 2 of the present invention.

FIG. 18 is a perspective view showing the basic configuration of a vapor deposition device according to Embodiment 2 of the present invention.

The vapor deposition source 60 has a plurality of vapor deposition source openings 61 arranged along a straight line parallel to the X axis direction at a fixed pitch in its upper surface (that is, the surface facing the vapor deposition mask 70). Each vapor deposition source opening 61 has a nozzle shape that is upwardly open parallel to the Z axis, and discharges the vapor deposition particles 91 that serve as materials for the coating film 90 toward the vapor deposition mask 70.

Figure 19:
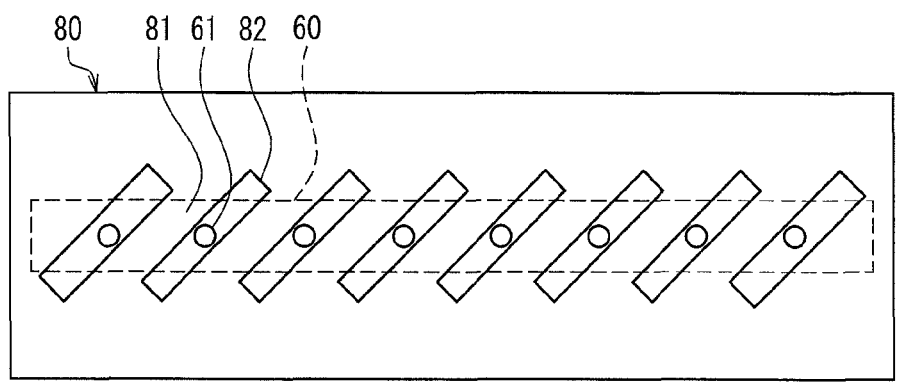
FIG. 19 is a plan view of a limiting unit to be used in the vapor deposition device shown in FIG. 18.

The limiting unit 80 is disposed above the vapor deposition source 60. FIG. 19 is a plan view of the limiting unit 80. The vapor deposition source 60 disposed below the limiting unit 80 is also shown in FIG. 19. A plurality of limiting openings 82, which are through holes respectively penetrating the limiting unit 80 in the Z axis direction, are formed in the limiting unit 80. The opening shape of the limiting opening 82 is substantially a rectangle whose longitudinal direction is slanted with respect to the X axis and Y axis. The plurality of limiting openings 82 are arranged in parallel to the X axis direction at the same pitch as that of the plurality of vapor deposition source openings 61. The plurality of limiting openings 82 correspond one-to-one to the plurality of vapor deposition source openings 61, and are each disposed above the corresponding vapor deposition source opening 61. The limiting openings 82 neighboring in the X axis direction are separated by a limiting portion 81. The limiting portions 81 are slanted with respect to the X axis and the Y axis.

Figure 20:
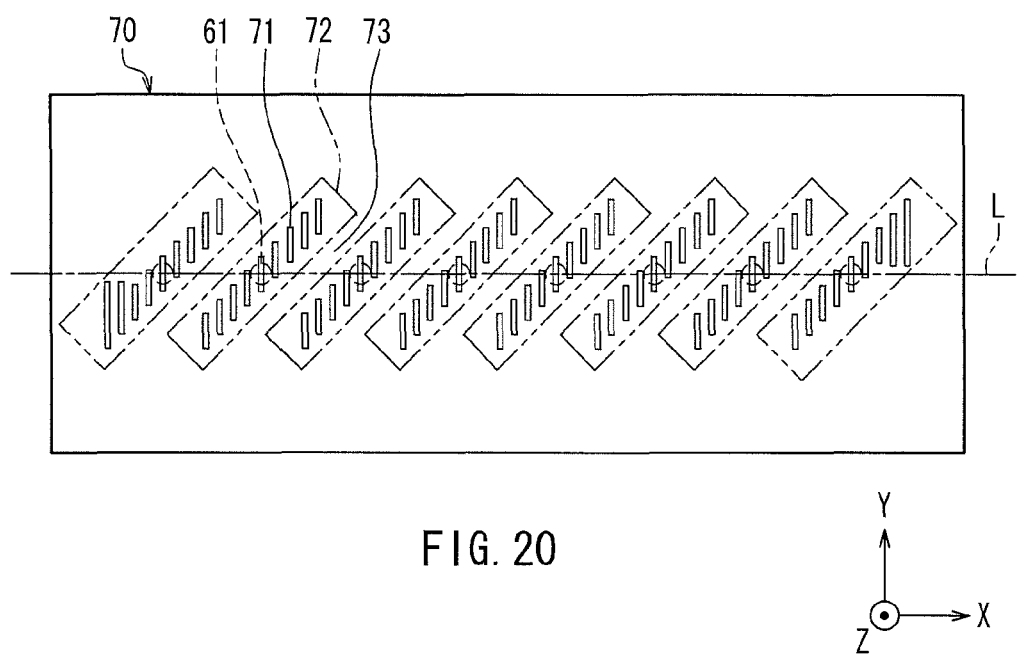
FIG. 20 is a plan view of a vapor deposition mask to be used in the vapor deposition device shown in FIG. 18.

The vapor deposition mask 70 is disposed on the opposite side of the limiting unit 80 from the vapor deposition source 60. FIG. 20 is a plan view of the vapor deposition mask 70. The vapor deposition source openings 61 of the vapor deposition source 60 disposed below the vapor deposition mask 70 are also shown in FIG. 20. Dash-double-dotted lines 72 indicate a vapor deposition region where the flow of the vapor deposition particles 91 (vapor deposition flow) that have been discharged from the vapor deposition source opening 61 and have passed through the limiting opening 82 corresponding to said vapor deposition source opening 61 reaches. A plurality of vapor deposition regions 72 are arranged along the X axis direction. The vapor deposition region 72 has a substantially rectangular shape corresponding to the opening shape of the limiting opening 82. The vapor deposition regions 72 neighboring in the X axis direction do not overlap, so as to be independent of each other, and a non-vapor deposition region 73 where the vapor deposition particles 91 do not reach is formed therebetween. A non-vapor deposition region 73 corresponds to the shadow region formed by the limiting portion 81 when viewed from the vapor deposition source opening 61. The non-vapor deposition regions 73 are slanted with respect to the X axis and the Y axis.

A plurality of mask openings 71 are formed only in the vapor deposition region 72 of the vapor deposition mask 70. The mask openings 71 are through holes that penetrate the vapor deposition mask 70 in the Z axis direction. The opening shape of a mask opening 71 is a slot shape that is parallel to the Y axis. All of the mask openings 71 may have the same shape and dimensions, or may have different shapes and dimensions. The pitch in the X axis direction of the mask openings 71 in each vapor deposition region 72 may be constant or different.

Similarly to Embodiment 1, also in Embodiment 2, the vapor deposition particles 91 discharged from the vapor deposition source openings 61 pass through the limiting openings 82 of the limiting unit 80 and the mask openings 71 of the vapor deposition mask 70 in this order, and adhere to the deposition surface (specifically, the surface of the substrate 10 facing the vapor deposition mask 70) 10e of the substrate 10. If the substrate 10 is moved in the direction of the arrow of the Y axis in FIG. 18, as shown in FIG. 21, stripe-shaped coating films 90 extending in the Y axis direction are formed on the substrate 10 at positions corresponding to the positions of each of the mask openings 71. As shown in FIG. 20, the vapor deposition regions 72 where a plurality of mask openings 71 are formed are slanted, and therefore portions of the vapor deposition regions 72 neighboring in the X axis direction face each other in the Y axis direction. Therefore, if the substrate 10 is moved in the direction of the arrow 10a in FIG. 21, the vapor deposition particles that have passed through the mask openings 71 located within a given vapor deposition region 72 adhere to a given position on the substrate 10, and then the vapor deposition particles that have passed through mask openings 71 located in the vapor deposition region 72 located on the left side of said vapor deposition region 72 adhere to the given position. In other words, the vapor deposition particles that have passed through two mask openings 71 having different positions in the Y axis direction adhere to the same position on the substrate 10. Note that in order to easily understand the pattern of the coating film 90 formed on the deposition surface 10e of the substrate 10, the coating film 90 is shown in FIG. 21 as though it is seen through the substrate 10.

Embodiment 2 is different from Embodiment 1 in that the longitudinal directions of both the limiting opening 82 and the vapor deposition region 72 are slanted with respect to the X axis and the Y axis. However, similarly to Embodiment 1, also in Embodiment 2, as shown in FIG. 20, the vapor deposition regions 72 are arranged along a straight line L indicated by a dash-dotted line that is parallel to the X axis with non-vapor deposition regions 73 being sandwiched therebetween so as to be independent of one another in the X axis direction. Furthermore, mask openings 71 are disposed only in vapor deposition regions 72. Therefore, as described in FIGS. 15A and 15B, also in Embodiment 2, even if the limiting unit 80 is displaced in the X axis direction with respect to the vapor deposition source 60 and the vapor deposition mask 70, the positions of the coating films 90 formed on the substrate 10 do not change.

Also, for example, mask openings 71 are formed at different positions in the Y axis direction from the positions of the non-vapor deposition regions 73 located on the straight line L of FIG. 20. Therefore, as shown in FIG. 21, it is possible to form a large amount of stripe-shaped coating films 90 at a substantially fixed short pitch in the X axis direction over a wide range of the substrate 10 in the X axis direction.

With Embodiment 2, the vapor deposition source openings 61, the limiting openings 82 and the vapor deposition regions 72 are respectively disposed along a straight line parallel to the X axis, and therefore, it is possible to reduce the weights and the dimensions in the Y axis direction of the vapor deposition source 60, the limiting unit 80 and the vapor deposition mask 70, as compared with Embodiment 1 in which the vapor deposition source openings 61a and 61b, the limiting openings 82a and 82b and the vapor deposition regions 72a and 72b are respectively disposed along two straight lines parallel to the X axis. Therefore, the present embodiment is effective for reducing the cost of the vapor deposition device and improving the precision of the dimensions of each member. Also, because the area of the vapor deposition mask 70 can be reduced, it is possible to reduce bending of the vapor deposition mask 70 due to its own weight and also improve the uniformity of tension applied to the vapor deposition mask 70. As a result, it is possible to improve the accuracy of the vapor deposition mask 70, and to improve the yield and the accuracy in the patterning of the coating film 90 formed on the substrate 10.

The vapor deposition particles 91 discharged from the vapor deposition source openings 61 have directionalities, and therefore the number of vapor deposition particles passing through mask openings 71 located at positions away from the vapor deposition source openings 61 (specifically, positions obliquely upward with respect to the vapor deposition source openings 61) is generally small. With Embodiment 2, as shown in FIG. 20, another mask opening 71 is disposed at a different position in the Y axis direction from the mask openings 71 located at the positions away from the vapor deposition source opening 61 so that one stripe-shaped coating film 90 is formed with these two mask openings 71 (see FIG. 21). Accordingly, the utilization efficiency of the vapor deposition material and throughput at the time of mass production are improved.

Note that one stripe-shaped coating film 90 cannot be formed in both end portions in the X axis direction by using a plurality of mask openings 71 having different positions in the Y axis direction in the manner described above, and therefore, as shown in FIG. 20, mask openings 71 located at both end portions in the X axis direction are extended in the Y axis direction. Accordingly, it is possible to form a plurality of coating films 90 having a uniform thickness over the entire range in the X axis direction.

Embodiment 2 is the same as Embodiment 1 except for the above. It is possible to apply the description of Embodiment 1 to Embodiment 2 without a change or with changes as appropriate.

Embodiment 3

Embodiment 3 is different from Embodiment 2 in the shapes of limiting openings 82 formed in the limiting unit 80 and the arrangement of mask openings 71 formed in the vapor deposition mask 70. Hereinafter, Embodiment 3 will now be described, focusing on differences from Embodiments 1 and 2. In diagrams referenced in the following description, the same reference numerals are given to components corresponding to the components described in Embodiments 1 and 2, and redundant description thereof will be omitted.

FIG. 22 is a plan view of the limiting unit 80 to be used in a vapor deposition device according to Embodiment 3 of the present invention. The vapor deposition source 60 disposed below the limiting unit 80 is also shown in FIG. 22. A plurality of limiting openings 82 that correspond one-to-one to a plurality of vapor deposition source openings 61 are formed in the limiting unit 80 in parallel to the X axis direction. Among a plurality of limiting openings 82, the limiting openings on both ends are substantially trapezoids (or pentagons), and the limiting openings other than these are triangles (equilateral triangles or isosceles triangles). The orientations of triangular limiting openings neighboring in the X axis direction are turned 180° from each other. The limiting openings 82 neighboring in the X axis direction are separated by a limiting portion 81. The limiting portions 81 are slanted with respect to the X axis and the Y axis.

FIG. 23 is a plan view of the vapor deposition mask 70 that fits the limiting unit 80 shown in FIG. 22. The vapor deposition source openings 61 of the vapor deposition source 60 arranged below the vapor deposition mask 70 are also shown in FIG. 23. Dash-double-dotted lines 72 indicate a vapor deposition region where the flow of the vapor deposition particles 91 (vapor deposition flow) that have been discharged from the vapor deposition source opening 61 and have passed through the limiting opening 82 corresponding to said vapor deposition source opening 61 reaches. A plurality of vapor deposition regions 72 are arranged along the X axis direction. The vapor deposition region 72 has a shape corresponding to the opening shape of the limiting opening 82 shown in FIG. 22. A plurality of mask openings 71 having a slot shape parallel to the Y axis are formed in each vapor deposition region 72. The vapor deposition regions 72 neighboring in the X axis direction do not overlap, so as to be independent of each other, and a non-vapor deposition region 73 where the vapor deposition particles 91 do not reach is formed therebetween. A non-vapor deposition region 73 corresponds to the shadow region formed by the limiting portion 81 when viewed from the vapor deposition source opening 61. The non-vapor deposition regions 73 are slanted with respect to the X axis and the Y axis.

FIG. 24 is a plan view of another limiting unit 80 to be used in the vapor deposition device according to Embodiment 3 of the present invention. The vapor deposition source 60 disposed below the limiting unit 80 is also shown in FIG. 24. A plurality of limiting openings 82 that correspond one-to-one to a plurality of vapor deposition source openings 61 are formed in the limiting unit 80 in parallel to the X axis direction. Among a plurality of limiting openings 82, the limiting openings on both ends have a substantially L shape, and the limiting openings other than these have a roughly Z shape. The limiting openings 82 neighboring in the X axis direction are separated by a limiting portion 81. The limiting portion 81 has a straight portion that is parallel to the X axis and straight portions that extend from both ends thereof and are parallel to the Y axis.

FIG. 25 is a plan view of the vapor deposition mask 70 that fits the limiting unit 80 shown in FIG. 24. The vapor deposition source openings 61 of the vapor deposition source 60 disposed below the vapor deposition mask 70 are also shown in FIG. 25. Dash-double-dotted lines 72 indicate a vapor deposition region where the flow of the vapor deposition particles 91 (vapor deposition flow) that have been discharged from the vapor deposition source opening 61 and have passed through the limiting opening 82 corresponding to said vapor deposition source opening 61 reaches. A plurality of vapor deposition regions 72 are arranged along the X axis direction. The vapor deposition region 72 has a shape corresponding to the opening shape of the limiting opening 82 shown in FIG. 24. A plurality of mask openings 71 having a slot shape parallel to the Y axis are formed in each vapor deposition region 72. The vapor deposition regions 72 neighboring in the X axis direction do not overlap in at least the X axis direction, so as to be independent of each other, and a non-vapor deposition region 73 where the vapor deposition particles 91 do not reach is formed therebetween. A non-vapor deposition region 73 corresponds to the shadow region formed by the limiting portion 81 when viewed from the vapor deposition source opening 61. The non-vapor deposition region 73 has a straight portion that is parallel to the X axis and straight portions that extend from both ends thereof and are parallel to the Y axis.

Similarly to Embodiments 1 and 2 described above, it is possible to form a plurality of stripe-shaped coating films 90 on the substrate 10 in either a case where the limiting unit 80 of FIG. 22 and the vapor deposition mask 70 of FIG. 23 are used or a case where the limiting unit 80 of FIG. 24 and the vapor deposition mask 70 of FIG. 25 are used. Also, similarly to Embodiment 2, a portion of coating films 90 among a plurality of coating films 90 are formed by the vapor deposition particles that respectively have passed through two mask openings 71 having different positions in the Y axis direction being overlapped.

Embodiment 3 is different from Embodiments 1 and 2 with regard to the shapes of limiting openings 82 and the arrangement of mask openings 71. However, similarly to Embodiments 1 and 2, also in Embodiment 3, as shown in FIGS. 23 and 25, the vapor deposition regions 72 are arranged along a straight line L indicated by a dash-dotted line that is parallel to the X axis with non-vapor deposition regions 73 being sandwiched therebetween so as to be independent of one another. Furthermore, mask openings 71 are disposed only in vapor deposition regions 72. Therefore, as described in FIGS. 15A and 15B, also in Embodiment 3, even if the limiting unit 80 is displaced in the X axis direction with respect to the vapor deposition source 60 and the vapor deposition mask 70, the positions of the coating films 90 formed on the substrate 10 do not change.

Also, for example, mask openings 71 are formed at different positions in the Y axis direction from the positions of the non-vapor deposition regions 73 located on the straight lines L of FIGS. 23 and 25. Therefore, similarly to Embodiments 1 and 2, it is possible to form a large amount of stripe-shaped coating films 90 at a substantially fixed short pitch over a wide range of the substrate 10 in the X axis direction.

As compared with Embodiment 2 (see FIG. 20), with Embodiment 3 (see FIGS. 23 and 25), mask openings 71 can be arranged in a wider region above the vapor deposition source openings 61, and therefore the amount of the vapor deposition material that passes through the limiting unit 80 and the vapor deposition mask 70 and reaches the substrate 10 can be further increased. Therefore, the vapor deposition material can be effectively used, and therefore the utilization efficiency of material and throughput at the time of mass production can be improved.

Similarly to Embodiment 2, also with Embodiment 3, the vapor deposition source openings 61, the limiting openings 82 and the vapor deposition regions 72 are respectively disposed along a straight line parallel to the X axis, and therefore, it is possible to reduce the weights and the dimensions in the Y axis direction of the limiting source 60, the limiting unit 80 and the vapor deposition mask 70. Therefore, the present embodiment is effective for reducing the cost of the vapor deposition device and improving the precision of the dimensions of each member. Also, because the area of the vapor deposition mask 70 can be reduced, it is possible to reduce bending of the vapor deposition mask 70 due to its own weight and also improve the uniformity of tension applied to the vapor deposition mask 70. As a result, it is possible to improve the accuracy of the vapor deposition mask 70, and to improve the yield and the accuracy in the patterning of the coating film 90 formed on the substrate 10.

Similarly to Embodiment 2, also with Embodiment 3, as shown in FIGS. 23 and 25, another mask opening 71 is disposed at a different position in the Y axis direction from the mask opening 71 located at the position away from the vapor deposition source opening 61 so that one stripe-shaped coating film 90 is formed with these two mask openings 71. Accordingly, the utilization efficiency of the vapor deposition material and throughput at the time of mass production are improved.

Note that one stripe-shaped coating film 90 cannot be formed in both end portions in the X axis direction by using a plurality of mask openings 71 having different positions in the Y axis direction in the manner described above, and therefore, as shown in FIGS. 23 and 25, mask openings 71 located at both end portions in the X axis direction are extended in the Y axis direction. Accordingly, it is possible to form a plurality of coating films 90 having a uniform thickness over the entire range in the X axis direction.

Embodiment 3 is the same as Embodiments 1 and 2 except for the above. It is possible to apply the description of Embodiments 1 and 2 to Embodiment 3 without a change or with changes as appropriate.

Embodiments 1 to 3 described above are merely examples. The present invention is not limited to Embodiments 1 to 3 described above, and can be changed as appropriate.

If the substrate 10 has a large dimension in the X axis direction, a plurality of vapor deposition units 50 as shown in the above-described embodiments may be arranged at different positions in the X axis direction and in the Y axis direction.

In Embodiments 1 to 3 described above, the substrate 10 is moved relative to the vapor deposition unit 50 that is stationary, but the present invention is not limited thereto. It is sufficient that one of the vapor deposition unit 50 and the substrate 10 is moved relative to the other. For example, it may be possible to fix the position of the substrate 10 and move the vapor deposition unit 50. Alternatively, both the vapor deposition unit 50 and the substrate 10 may be moved.

In Embodiments 1 to 3 described above, the substrate 10 is disposed above the vapor deposition unit 50, but the relative positional relationship between the vapor deposition unit 50 and the substrate 10 is not limited thereto. It may be possible to, for example, dispose the substrate 10 below the vapor deposition unit 50 or dispose the vapor deposition unit 50 and the substrate 10 so as to oppose each other in the horizontal direction.

In Embodiments 1 to 3 described above, a case where a light emitting layer for an organic EL element is formed is described as an example, but the present invention is not limited thereto. For example, the present invention can be used for a case where the thickness of layers other than the light emitting layer for an organic EL element is changed for each color in order to match the current-voltage characteristics for each color, adjust an emission spectrum by a microcavity effect, or the like. Furthermore, the present invention can be used for a case where various types of thin films other than a thin film constituting an organic EL element are formed by a vapor deposition method.

INDUSTRIAL APPLICABILITY

There is no particular limitation on the fields to which the present invention can be applied, and the present invention is preferably used to form light emitting layers for use in organic EL display devices.

DESCRIPTION OF SYMBOLS

10 Substrate
10*a* First Direction (Movement Direction of Substrate)
10*e* Deposition Surface
20 Organic EL Element
23R, 23G, 23B Light Emitting Layer
50 Vapor Deposition Unit
56 Moving Mechanism
60 Vapor Deposition Source
60*a* First Vapor Deposition Source
60*b* Second Vapor Deposition Source
61,61*a*,61*b* Vapor Deposition Source Opening
70 Vapor Deposition Mask
71,71*a*,71*b* Mask Opening
72,72*a*,72*b* Vapor Deposition Region
73,73*a*,73*b* Non-Vapor Deposition Region
80 Limiting Unit
81,81*a*,81*b* Limiting Portions
82,82*a*,82*b* Limiting Opening
90 Coating Film
90*e* Blurred Portion
90*c* Coating Film Main Portion
91,91*a*,91*b* Vapor Deposition Particles
L,La,Lb,Lc,Ld Straight Line Parallel to Second Direction

The invention claimed is:

1. A vapor deposition device that forms a coating film having a predetermined pattern on a substrate, the vapor deposition device comprising:
a vapor deposition unit and a moving mechanism that moves one of the substrate and the vapor deposition unit relative to the other along a first direction that is orthogonal to a normal line direction of the substrate,
the vapor deposition unit comprising:
a vapor deposition source having a plurality of vapor deposition source openings that respectively discharge vapor deposition particles;
a limiting unit having a plurality of limiting openings through which the vapor deposition particles discharged from the plurality of vapor deposition source openings respectively pass; and
a vapor deposition mask in which a plurality of mask openings are formed only in a plurality of vapor deposition regions where the vapor deposition particles that have respectively passed through the plurality of limiting openings reach,
wherein the plurality of vapor deposition regions are arranged along a second direction that is orthogonal to the normal line direction and the first direction with non-vapor deposition regions where the vapor deposition particles do not reach being sandwiched therebetween,
the plurality of mask openings through which the vapor deposition particles pass are formed at different positions in the first direction from the positions of the non-vapor deposition regions located on a straight line parallel to the second direction, as viewed along the normal line direction,
the plurality of vapor deposition regions are arranged in a staggered arrangement along two straight lines that are parallel to the second direction and are located at different positions in the first direction, as viewed along the normal line direction, and
the plurality of limiting openings are arranged along the second direction with limiting portions being sandwiched therebetween, and the non-vapor deposition regions correspond to shadow regions formed by the limiting portions when viewed from the vapor deposition source openings,
wherein a shared coating film is formed by overlaying vapor deposition particles that have passed through a plurality of mask openings arranged at different positions in the first direction,
wherein the plurality of vapor deposition regions have a first vapor deposition regions arranged along a first straight line that is parallel to the second direction, and second vapor deposition regions arranged along a second straight line that is parallel to the second direction and that is located at a different position in the first direction from the position of the first straight line, the plurality of mask openings have first mask openings formed in each of the first vapor deposition regions, and second mask openings formed in each of the second vapor deposition regions, the plurality of vapor deposition source openings have first vapor deposition source openings each discharging first vapor deposition particles that reach the first vapor deposition regions, and second vapor deposition source openings each discharging second vapor deposition particles that reach the second vapor deposition regions, the first vapor deposition source openings and the second vapor deposition source openings are arranged at different positions in the first direction and the second direction, and the first vapor deposition particles and the second vapor deposition particles are formed of the same material.

2. The vapor deposition device according to claim 1, wherein the width of the vapor deposition region in the second direction is larger than the width of a region in the second direction where mask openings are present in the vapor deposition region.

3. A vapor deposition method comprising a vapor deposition step of forming a coating film having a predetermined pattern on a substrate by causing vapor deposition particles to adhere onto the substrate, wherein the vapor deposition step is performed by using the vapor deposition device according to claim 1.

4. The vapor deposition device according to claim 1, wherein the plurality of vapor deposition regions have a first vapor deposition region arranged along a first straight line that is parallel to the second direction, and a second vapor deposition region arranged along a second straight line that is parallel to the second direction and that is located at a different position in the first direction from the position of the first straight line, the plurality of mask openings have a first mask opening formed in the first vapor deposition region, and a second mask opening formed in the second vapor deposition region, and the first mask opening and the second mask opening are arranged at totally different positions in the second direction.

5. The vapor deposition device according to claim 1, wherein the first vapor deposition source openings are arranged at a fixed pitch along the second direction, the second vapor deposition source openings are arranged at a fixed pitch along the second direction, the pitch of the first vapor deposition source openings in the second direction and the pitch of the second vapor deposition source openings in the second direction are the same, and the positions of first vapor deposition source openings in the second direction are positionally offset by half a pitch thereof in the second direction, with respect to the positions of the second vapor deposition source openings in the second direction.

6. The vapor deposition device according to claim 1, wherein the second vapor deposition source openings are arranged at the same positions in the second direction as first non-vapor deposition regions, as viewed along the normal line direction, the first non-vapor deposition regions being located between the first vapor deposition regions neighboring in the second direction.

* * * * *